United States Patent
Tanaka

(10) Patent No.: US 8,391,015 B2
(45) Date of Patent: Mar. 5, 2013

(54) CAPACITOR-INCORPORATED PRINTED WIRING BOARD AND ELECTRONIC COMPONENT

(75) Inventor: Hironori Tanaka, Gifu (JP)

(73) Assignee: Ibiden Co., Ltd., Ogaki-shi (JP)

( * ) Notice: Subject to any disclaimer, the term of this patent is extended or adjusted under 35 U.S.C. 154(b) by 672 days.

(21) Appl. No.: 12/357,867

(22) Filed: Jan. 22, 2009

(65) Prior Publication Data
US 2009/0231820 A1 Sep. 17, 2009

Related U.S. Application Data

(60) Provisional application No. 61/037,101, filed on Mar. 17, 2008.

(51) Int. Cl.
*H05K 7/00* (2006.01)
(52) U.S. Cl. .................................. 361/760; 361/766
(58) Field of Classification Search .................. 361/765, 361/760, 766; 174/260, 261, 262
See application file for complete search history.

(56) References Cited

U.S. PATENT DOCUMENTS

| | | | |
|---|---|---|---|
| 6,370,013 B1* | 4/2002 | Iino et al. | 361/306.3 |
| 6,998,308 B2* | 2/2006 | Ooi et al. | 438/253 |
| 2002/0180063 A1* | 12/2002 | Iwaki et al. | 257/778 |
| 2003/0063453 A1* | 4/2003 | Kusagaya et al. | 361/794 |
| 2006/0137905 A1* | 6/2006 | Kariya et al. | 174/255 |
| 2006/0220167 A1* | 10/2006 | Min et al. | 257/499 |
| 2008/0223603 A1* | 9/2008 | Kim et al. | 174/255 |

FOREIGN PATENT DOCUMENTS

| | | |
|---|---|---|
| EP | 1 696 716 A1 | 8/2006 |
| JP | 2005-191559 | 7/2005 |

* cited by examiner

*Primary Examiner* — Yuriy Semenenko
(74) *Attorney, Agent, or Firm* — Oblon, Spivak, McClelland, Maier & Neustadt, L.L.P.

(57) ABSTRACT

A printed wiring board includes an insulating layer and a capacitor including a ceramic high dielectric layer being interposed between a first and a second electrode, and a semiconductor device mounting pad, including a first and a second pad, formed on an outermost resin insulating layer of the resin insulating layers. An underfill which covers an area larger than that of the high dielectric layer is formed, when the underfill covered area is projected along a lamination direction of the resin insulating layers to a face on which the high dielectric layer is formed. The capacitor is located immediately beneath the underfill covered area.

10 Claims, 14 Drawing Sheets

Fig.1
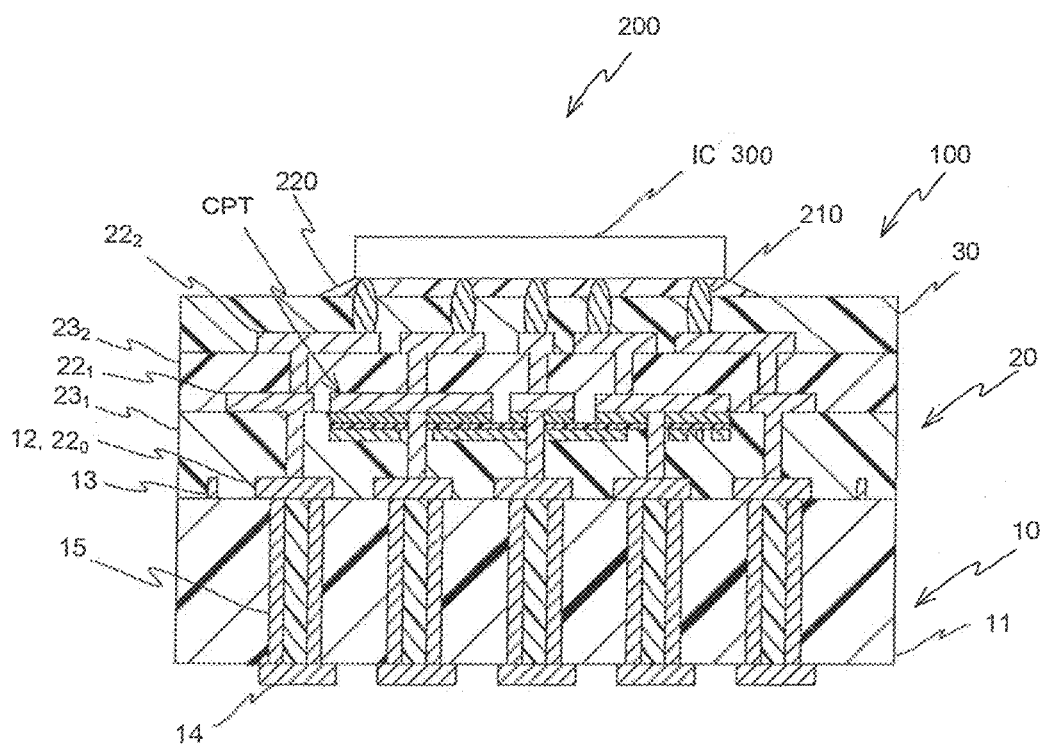
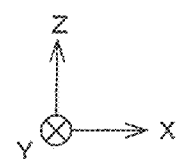

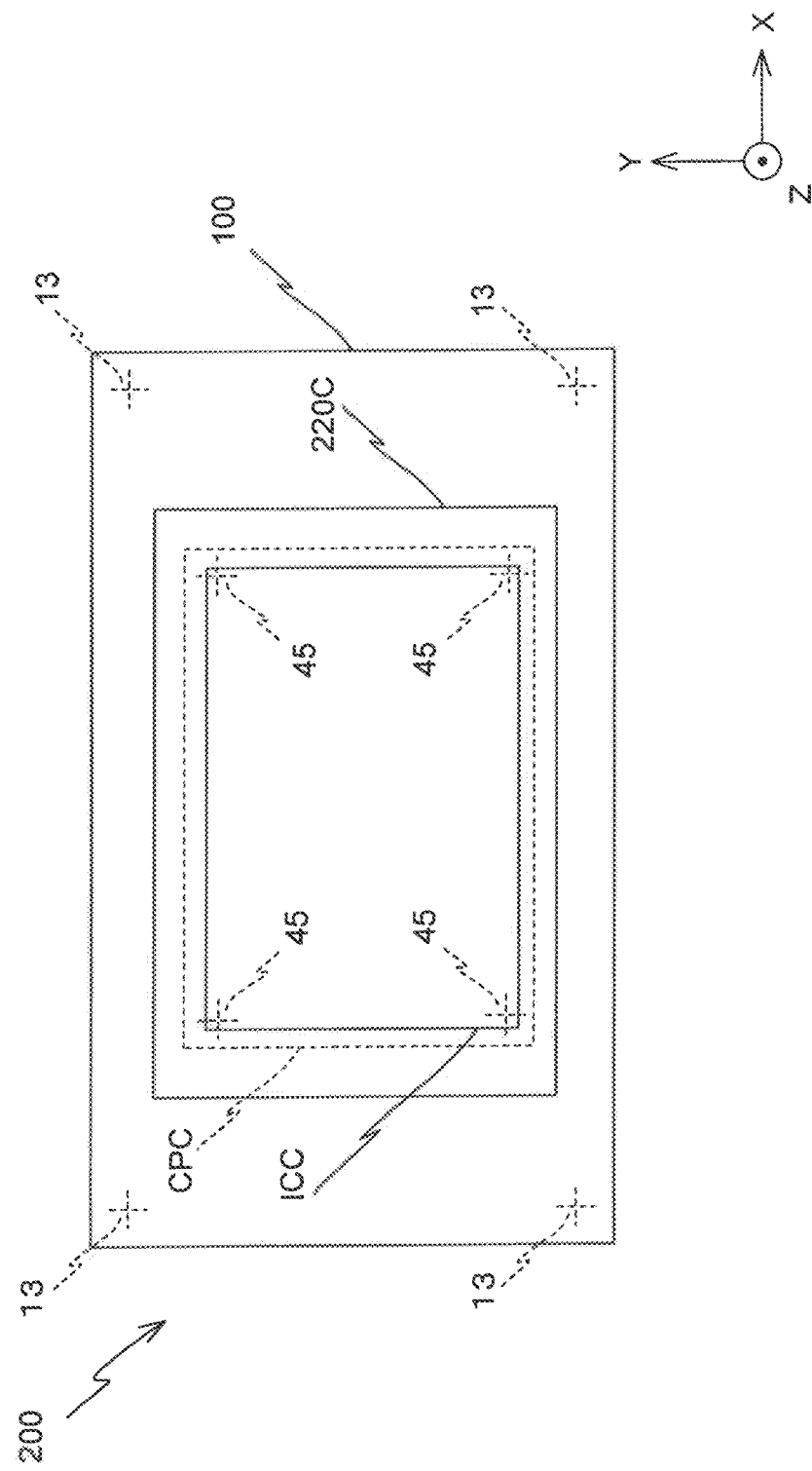

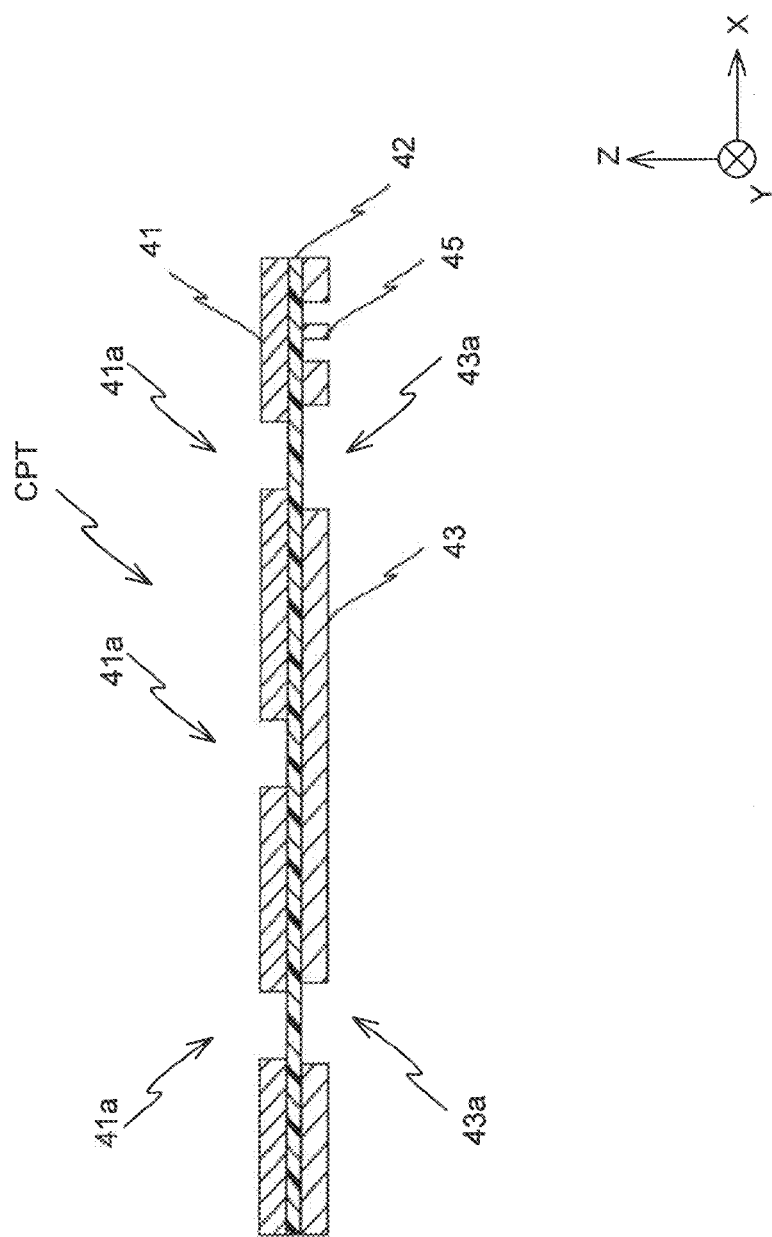

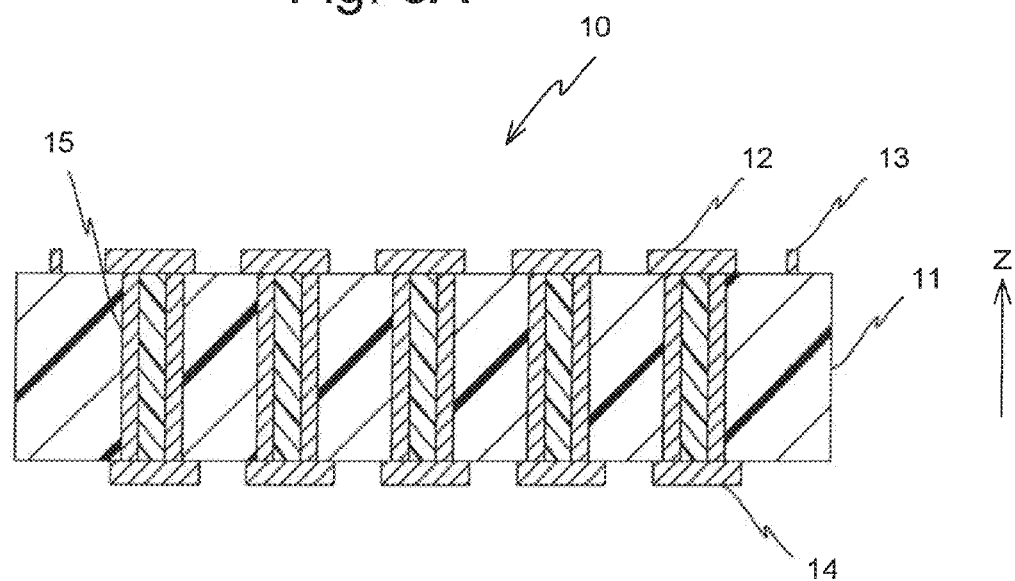
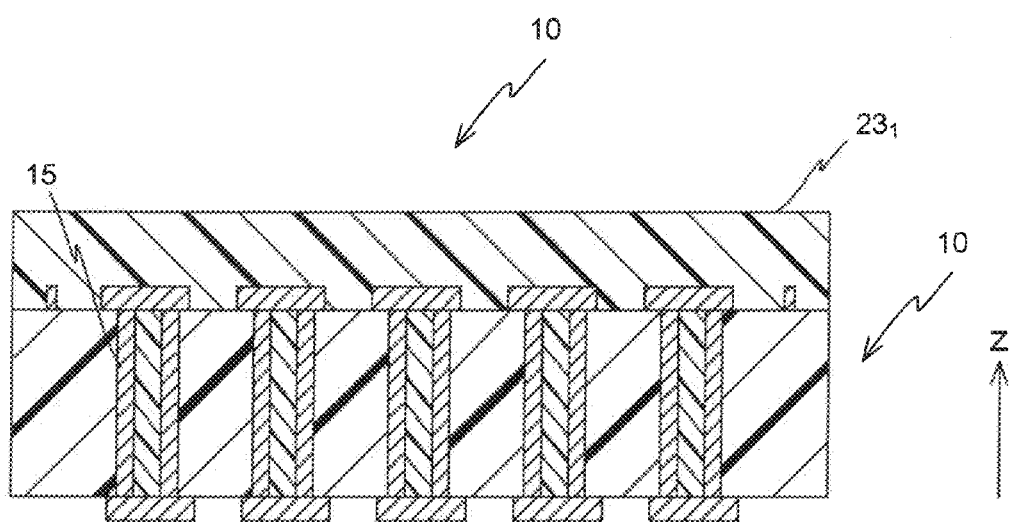

CAPACITOR-INCORPORATED PRINTED WIRING BOARD AND ELECTRONIC COMPONENT

CROSS-REFERENCE TO RELATED APPLICATIONS

The present application claims the benefits of priority to U.S. Application No. 61/037,101, filed Mar. 17, 2008. The contents of that application are incorporated herein by reference in their entirety.

BACKGROUND OF THE INVENTION

1. Technical Field

The present invention relates to a capacitor-incorporated printed wiring board which incorporates a capacitor having a ceramic high dielectric layer sandwiched by a first electrode and a second electrode and also has a pad for mounting a semiconductor device, and an electronic component.

2. Background Art

Japanese Patent Application Laid-Open (JP-A) No. 2005-191559 (patent document 1, which is referred to as a conventional example) has disclosed a built-up multilayered printed wiring board incorporating a capacitor portion having a structure in which a ceramic high dielectric layer is sandwiched by a lower electrode and an upper electrode. The contents of this publication are incorporated herein by reference in their entirety.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 1 is a sectional view schematically showing an external structure of an electronic component according to an embodiment of the present invention.

FIG. 2 is a plan view showing alignment marks and the relationship in size among a printed wiring board, an underfill material and an integrated circuit chip according to the embodiment of the invention.

FIG. 3 is a sectional view showing the structure of a layered capacitor according to the embodiment of the invention.

FIG. 5A is a view showing a process of manufacturing an electronic component according to an embodiment of the invention (1).

FIG. 5B is a view showing the process of manufacturing the electronic component according to the embodiment of the invention (2).

BRIEF SUMMARY OF EMBODIMENTS OF THE INVENTION

Figure 4A:
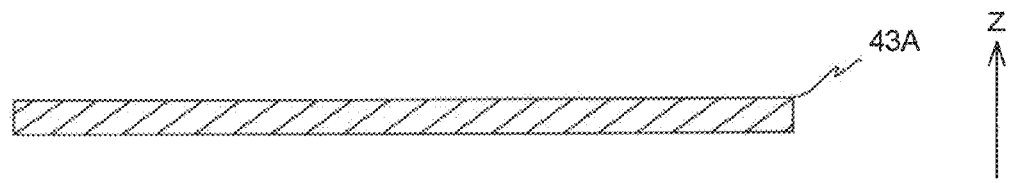
FIG. 4A is a view showing a process of manufacturing a layered capacitor according to the embodiment of the invention (1).

One aspect of the invention includes an insulating layer and a capacitor including a ceramic high dielectric layer, a first electrode and a second electrode, the high dielectric layer being interposed between the first and second electrodes. A plurality of resin insulating layers are formed on the insulating layer and include an upper resin insulating layer provided on a first electrode side of the capacitor, and a lower resin insulating layer provided on a second electrode side of the capacitor. A semiconductor device mounting pad includes a first pad and a second pad, the semiconductor device mounting pad being formed on an outermost resin insulating layer of the resin insulating layers, and a first via conductor is formed in at least one of the resin insulating layers to electrically connect the first pad with the first electrode. A second via conductor is formed in at least another one layer of the resin insulating layers to electrically connect the second pad with the second electrode, and an underfill covered area covered with an underfill resin is provided between the semiconductor device and the printed wiring board. The underfill covered area is provided on a surface of the printed wiring board facing the semiconductor device. When the underfill covered area is projected along a lamination direction of the resin insulating layers to a face on which the high dielectric layer is formed, the underfill covered area is larger than an area in which the high dielectric layer is formed. The capacitor is located under the underfill covered area.

DETAILED DESCRIPTION OF EMBODIMENTS OF THE INVENTION

In the built-up multilayered wiring board described in the conventional example, the dielectric layer of the capacitor is made of ceramic and its thickness is made small in order to secure a high electrostatic capacitance of the capacitor incorporated. However, it is believed that the built-up multilayered printed wiring board incorporating the capacitor portion has such a problem that the dielectric layer is likely to be cracked by a change in temperature because of a difference in thermal expansion coefficient between the ceramic dielectric layer and the printed wiring board.

Further, it is believed that because the thickness of the dielectric layer is small, the dielectric layer is likely to suffer from a defect. Then, it is believed that if a crack or defect occurs in the dielectric layer, leakage of a current easily occurs due to absorption of humidity, thereby leading to drop in insulation reliability.

The present invention has been achieved to solve the above-described problem, and an object of the invention is to provide a multilayered printed wiring board excellent in insulation reliability while maintaining a sufficient decoupling effect.

According to an aspect of the present invention, there is provided a capacitor-incorporated printed wiring board, including: an insulating layer; a capacitor including a ceramic high dielectric layer and a first electrode and a second electrode sandwiching the high dielectric layer; a plurality of resin insulating layers which are formed on the insulating layer and which have an upper resin insulating layer and a lower resin insulating layer sandwiching the capacitor; a semiconductor device mounting pad including a plurality of first pads and a plurality of second pads, the semiconductor device mounting pad being formed on a uppermost resin insulating layer of the resin insulating layers; a first via conductor formed in at least one layer of the resin insulating layers to electrically connect the first pad with the first electrode; and a second via conductor formed in at least one layer of the resin insulating layers to electrically connect the second pad with the second electrode, wherein an underfill covered area which is covered with an underfill resin filled between the semiconductor device and the printed wiring board exists on a surface of the printed wiring board facing the semiconductor device, and when the underfill covered area is projected to a face on which the high dielectric layer is formed, in parallel along a lamination direction of the resin insulating layers, the underfill covered area is larger than an area in which the high dielectric layer is formed; and the capacitor is located just under the underfill covered area.

It is preferable that the semiconductor device mounting pad is formed in a pad formation area, and that when the high dielectric layer is projected to the face on which the pad is formed, in parallel along the lamination direction of the resin insulating layers, the pad formation area is smaller than the area in which the high dielectric layer is formed. The pad formation area is a quadrangular area or rectangular or square area whose area is minimized while including all the pads.

It is preferable that when a semiconductor device is mounted on the printed wiring board via the semiconductor device mounting pad, the capacitor is located just under the semiconductor device, and that when the semiconductor device is projected to the face on which the high dielectric layer is formed, in parallel along the lamination direction of the resin insulating layers, the semiconductor device mounting area is contained in the area in which the high dielectric layer is formed.

Preferably, the underfill resin is formed on the uppermost resin insulating layer. The solder resist layer is preferred to be formed on the uppermost resin insulating layer and the underfill resin is preferred to be formed on the solder resist layer.

Preferably, the high dielectric layer is manufactured by baking a raw material containing at least one metal oxide selected from a group consisting of barium titanate, strontium titanate, tantalum oxide, lead zirconate titanate, lanthanum lead zirconate titanate, niobium lead zirconate titanate, calcium lead zirconate titanate and strontium lead zirconate titanate.

Preferably, the resin insulating layer is a resin insulating layer which does not contain glass cloth, glass unwoven fabric or aramid fiber, etc. as its core material thereof while it contains other filler than a continuous glass fiber. Further, it is preferable that the second electrode is an power supply electrode made of copper and the first electrode is a ground electrode made of nickel.

Preferably, the insulating layer is a cured resin substrate which has glass cloth or glass unwoven fabric as its core material and the core material is impregnated with a thermosetting resin.

According to another aspect of the present invention, there is provided an electronic component including: the capacitor-incorporated printed wiring board; an IC chip mounted on a surface of the printed wiring board; and an underfill material filled between the surface of the printed wiring board and the IC chip.

In the capacitor-incorporated printed wiring board, a layered capacitor having a high dielectric layer and first and second layered electrodes sandwiching the high dielectric layer is formed just under the underfill covered area, and the size thereof is smaller than the covered area. Consequently, not only the size of the electrode area of the layered capacitor is secured, but also the layered capacitor is incorporated in a portion of the printed wiring board having small warp and deformation. This results in suppression of generation of cracks in a thin fragile high dielectric layer.

The length of wiring from an external power supply to the layered capacitor can be reduced, and the length of wiring up to the IC chip can be also reduced. Consequently, even if a semiconductor device (IC chip) in which the interval of on/off of the semiconductor device is short and the frequency is as high as 3 GHz to 20 GHz is used, a sufficient decoupling can be obtained.

The electronic component using the capacitor-incorporated printed wiring board having such a configuration can suppress generation of cracks in the thin, fragile high dielectric layer and obtain a sufficient decoupling effect.

EFFECT OF THE INVENTION

With the above-described configuration, a warp in the printed wiring board can be suppressed small and cracks can be prevented from occurring in the layered capacitor. This enables to raise the insulation reliability of the printed wiring board.

As a result of using the printed wiring board having the above-described configuration, an instantaneous drop in potential of the power supply line can be suppressed. Accordingly, a printed wiring board for mounting an IC chip is provided that has a high operation stability against high frequency. Further, an electronic component having a high insulation stability and a high operation stability against high frequency is provided.

Examples of a printed wiring board and an electronic component of the present invention will be described in detail as with reference to FIGS. 1 to 11. In the following description and drawings, similar functional components may be denoted by similar reference numerals in FIG. 4, and duplicated description thereof may be omitted.

Referring to FIG. 1, a semiconductor device (e.g. IC chip) 300 is mounted on a printed wiring board 100 according to a first embodiment of the present invention, and underfill resin 220 is filled between the semiconductor device (e.g. IC chip) and the printed wiring board. Here, the IC chip is loaded on a semiconductor device mounting pad through solder members (solder bumps) 210. The semiconductor device mounting pad is part of a conductive circuit (wiring pattern) 22 on a surface in a +z direction of the printed wiring board 100. Then, the underfill material 220 is filled between the printed wiring board 100 and the IC chip.

For example, a thermo setting epoxy resin or silicon resin is used as the underfill material 220. The underfill material 220 may contain a rubber base resin such as SBR, NBR and urethane or inorganic short fibrous, spherical, tabular particles such as silica, alumina and zirconia.

The underfill material 220 is preferred to be in a low range of 10 to 1,000 MPa in terms of Young's modulus. Even if a stress originating from a difference in thermal expansion coefficient is generated between the IC chip and the printed wiring board 100, the stress can be relaxed sufficiently if the Young's modulus of the underfill material 220 is in this range.

The printed wiring board 100 includes (a) a core substrate 10, (b) a laminated portion 20 formed on a surface (first surface) in the +z direction of the core substrate 10, and (c) a solder resist 30 formed on the surface in the +z direction of the laminated portion 20.

The core substrate 10 includes (i) an insulating layer 11, (ii) a conductor circuit (wiring pattern) 12 and alignment marks 13 formed on a surface in the +z direction of the insulating layer 11, (iii) a conductor circuit (wiring pattern) 14 formed on a surface (second surface) in the −z direction of the insulating layer 11, and (iv) through hole conductors 15 which make interlayer connection between the conductor circuit 12 and the conductor circuit 14.

The alignment marks 13 are formed on the surface in the +z direction of the insulating layer 11 except at portions just under a portion in which a layered capacitor CPT, described later, is formed.

The laminated portion 20 includes (i) a resin insulating layer $23_j$ (j=1 to N: N=2 in this embodiment), (ii) a conductor circuit (wiring pattern) $22_j$ (j=1 to N: N=2 in this embodiment), (iii) a via conductor $24_j$ (j=1 to N: N=2 in this embodiment) which makes interlayer connection between a conductor circuit $22_{j-1}$ (here, the conductor circuit 12 is regarded as the conductor circuit $22_0$) and the conductor circuit (wiring pattern) $22_j$, and (iv) a layered capacitor CPT.

Referring to FIG. 1, the layered capacitor is formed between a first surface of a resin insulating layer (resin insulating layer on core) $23_1$ formed on a core substrate and a second surface of a uppermost resin insulating layer $23_2$. The first surface of the resin insulating layer on the core refers to a surface opposite to the side in contact with the core substrate. The uppermost resin insulating layer is a resin insulating layer located most outside of the resin insulating layers, and a semiconductor device mounting pad is formed on the first surface of the uppermost resin insulating layer. The second surface of the uppermost resin insulating layer is a surface opposite to the surface (first surface of the uppermost resin insulating layer) of the uppermost resin insulating layer in which the semiconductor device mounting pad is formed.

Figure 11:
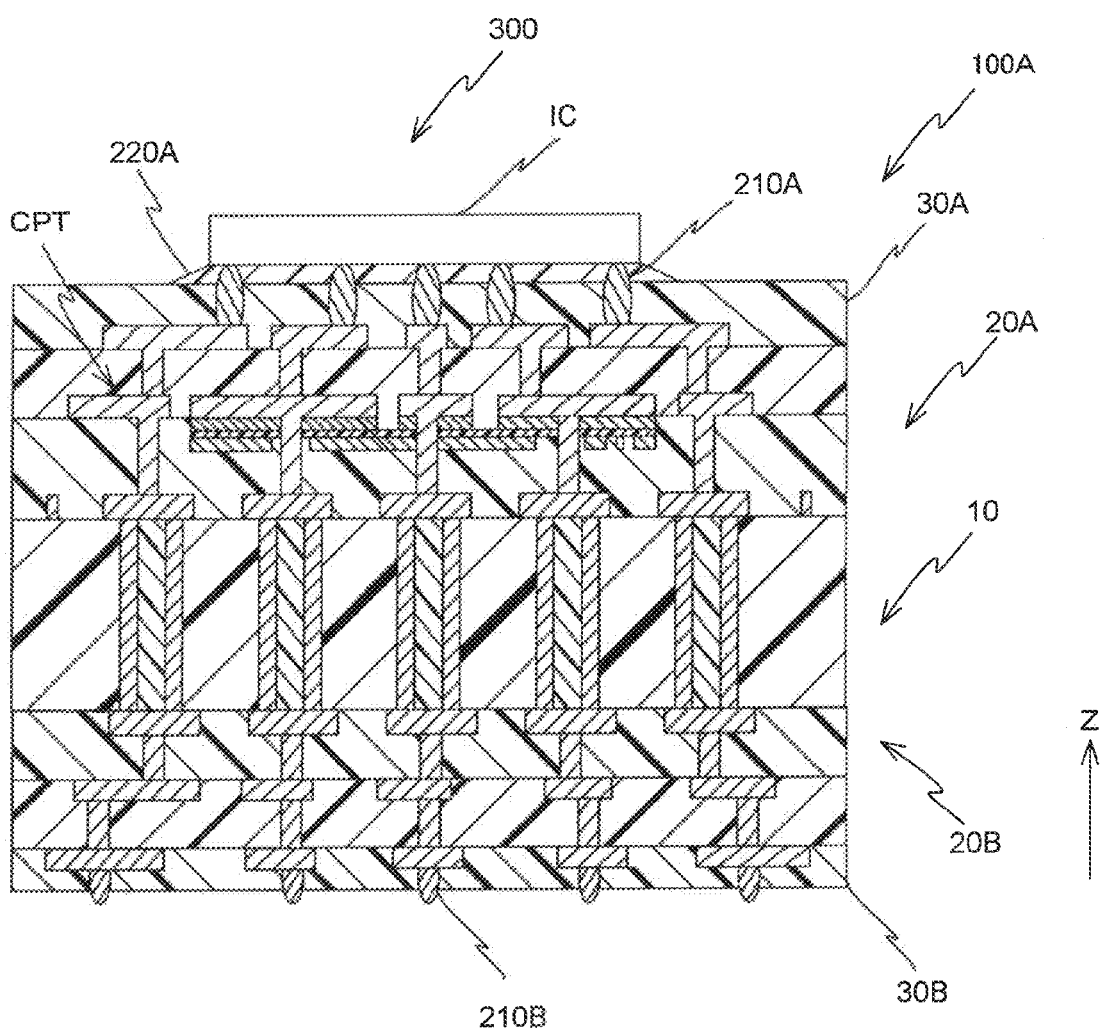
FIG. 11 is a sectional view schematically showing an external structure of an electronic component according to another embodiment of the invention.

FIG. 11 shows another embodiment of the present invention. In FIG. 11, the layered capacitor formation position is the same as in FIG. 1, and the resin insulating layer, the via conductors and the conductor circuit are formed also on the surface in the −z direction (opposite to the surface on which the IC chip is loaded). The layered capacitor formation position can be changed by increasing the quantity of the resin insulating layers formed. For example, the layered capacitor may be formed between the second surface of the uppermost resin insulating layer and the first surface of the resin insulating layer of a first inner layer. Here, the resin insulating layer of the first inner layer is a resin insulating layer which is formed under the uppermost resin insulating layer while keeping contact with the second surface of the uppermost resin insulating layer. The first surface of the resin insulating layer of the first inner layer is a surface which faces the second surface of the uppermost resin insulating layer.

As shown in FIGS. 1 and 11, the layered capacitor is preferably arranged near a core substrate or an IC chip having a high stiffness. By doing so, the layered capacitor is arranged at a portion having a small deformation due to a warp originating from thermal expansion or thermal contraction, so that a stress applied to the layered capacitor is reduced. This results in improvement of the reliability of the capacitor-incorporated printed wiring board.

Further, one electrode of the layered capacitor CPT is electrically connected to a ground line while the other electrode is electrically connected to a power supply line.

In the meantime, part of the conductor circuit (wiring pattern) $22_2$ formed on the uppermost resin insulating layer $23_2$ is used as a semiconductor device mounting pad for mounting the IC chip (see FIG. 1). The semiconductor device mounting pad is comprised of a first pad, a second pad and a third pad, which constitute a pad group two-dimensionally on the uppermost resin insulating layer. The first pad is electrically connected to a ground of the semiconductor device. The second pad is electrically connected to a power supply of the semiconductor device. The third pad is electrically connected to a signal of the semiconductor device.

An electric component 200 shown in FIG. 1 indicates a preferred usage method of the printed wiring board 100 of the first embodiment of the invention. The electric component 200 includes the printed wiring board 100, an IC chip 300 mounted on the printed wiring board through a solder bump 210 formed on the pad, and an underfill resin 220 filled between the IC chip and the printed wiring board 100.

FIG. 2 shows a preferred example, in terms of the size of an underfill covered area, of an IC chip and a layered capacitor and the positional relation in the sectional direction. In the electronic component 200, the IC chip, the layered capacitor CPT and the underfill covered area have a relationship in size as shown in FIG. 2 which is a XY plan view of the electronic component 200. That is, when projection in the Z direction (direction to the section of the printed wiring board) CPC is carried out, the area (the dotted line indicates the outer periphery of high dielectric layer) in which the layered capacitor CPT is formed is included in the underfill covered area 220C. When projection in the Z direction is carried out, the area CPC in which the layered capacitor CPT is formed includes the IC chip. Here, the underfill covered area 220C is a portion of the surface of the printed wiring board covered by the underfill covered area 220C. The size of the IC chip is a size ICC (area of a portion surrounded by the outer periphery of the IC chip) of a plane in parallel to the surface of the printed wiring board.

That is, the size CPC (area of a portion surrounded by the outer periphery of the high dielectric layer) of the high dielectric layer is smaller than the size 220C (area of a portion of the surface of the printed wiring board covered with the underfill) and larger than the IC chip. Then, the high dielectric layer (layered capacitor) is located just under the underfill covered area 220C and the IC chip. When the high dielectric layer is arranged at such a location with such a size, the high dielectric layer becomes hard to suffer from cracks. The reason is that the layered capacitor is incorporated in a portion of the printed wiring board having smaller warp and deformation. Additionally, because the high dielectric layer made of ceramic is increased, the thermal expansion coefficient of the printed wiring board can be brought close to the IC chip. Consequently, the amount of the warp of the printed wiring board is reduced.

A stress due to a difference in thermal expansion is a problem in an area just under the IC chip. For this reason, if the underfill is formed in this area, it is possible to effectively prevent generation of cracks in the dielectric layer of the layered capacitor while suppressing the material cost.

As shown in FIG. 3, the layered capacitor CPT includes (i) a high dielectric layer 42 produced by baking a ceramic-based high dielectric material described later at high temperature, (ii) a second layered electrode 41 which is a conductor pattern formed on a surface in the +z direction of the high dielectric layer 42, and (iii) a first layered electrode 43 which is a conductor pattern and alignment marks 45, formed on a surface in the −z direction of the high dielectric layer 42.

The first layered electrode 43 is electrically connected to the ground and the second layered electrode 41 is electrically connected to the power supply line. The first layered electrode 43 and the second layered electrode 41 are composed of metal selected from a group consisting of nickel, copper, platinum, gold, chrome and titan, and may be constituted of the same metal or may be constituted of different metals. The alignment mark 45 is composed of the same material as the first layered electrode 43 and is not connected to any wiring pattern.

If copper and nickel are used as its electrodes upon manufacturing this capacitor, it may be constructed, for example, so that an electrode made of copper is for the ground while an electrode made of nickel is for the power supply and conversely, so that the electrode made of copper is for the power supply while the electrode made of nickel is for the ground.

The second layered electrode 41 is a plane pattern having openings 41a. A via conductor (first via conductor) or a land (first via land), electrically connected to the first pad of the aforementioned via conductor $24_1$, is formed within the opening 41a. A space (conductor non-formation area) is formed between the second layered electrode and the first via land and between the second layered electrode and the first via conductor in order to prevent both of them from being short-circuited.

As the quantity of the openings 41a is decreased, the area of the second layered electrode 41 can be secured larger, whereby the electrostatic capacitance of the layered capacitor CPT is increased. The openings 41a may be arranged appropriately considering the electrostatic capacitance of the layered capacitor CPT and the like.

The second via conductor is electrically connected to the second layered electrode. The second layered electrode and the second pad are electrically connected through the second via conductor.

The first layered electrode 43 is a plane pattern having openings 43a. A via conductor (second via conductor), electrically connected to the second pad within the via conductor $24_1$, is formed in the opening 43a. A space (conductor non-formation area) is formed between the second via conductor and the first layered electrode in order to prevent both of them from being short-circuited. As the quantity of the openings 43a is decreased, the area of the first layered electrode 43 can be secured large, whereby the electrostatic capacitance of the layered capacitor CPT is increased. The openings 43a may be arranged appropriately considering the electrostatic capacitance of the layered capacitor CPT and the like.

The first via conductor is electrically connected to the first layered electrode. The first layered electrode and the first pad are electrically connected through the first via conductor. In this way, the first layered electrode is electrically connected to the first pad (grounding pad) for mounting the IC chip and the second layered electrode is electrically connected to the second pad (power supply pad) for mounting the IC chip. Because the IC chip and the layered capacitor are electrically connected, the printed wiring board 100 can achieve a decoupling function of suppressing an instantaneous drop in potential of the IC chip.

Here, the first via conductor and the second via conductor may be arranged alternately in a grid pattern. Consequently, loop inductance drops so that the instantaneous drop in power supply potential is easy to block. The first via conductor and the second via conductor may be arranged alternately in a staggered fashion and in this case also, the same effect can be obtained.

A distance between the first and second layered electrodes 41, 43 is not more than 10 μm and substantially set to a distance which does not cause short-circuit therebetween.

Preferably, the high dielectric layer 42 is manufactured by baking a raw material containing at least one metal oxide selected from a group consisting of barium titanate ($BaTiO_3$), strontium titanate ($SrTiO_3$), tantalum oxide ($TaO_3$, $Ta_2O_5$), lead zirconate titanate ($Pb(Zr, Ti)O_3$; PZT), lanthanum lead zirconate titanate ($(Pb, La)(Zr, Tr)O_3$; PLZT), niobium lead zirconate titanate ($(Pb, Nb)(Zr, Tr)O_3$; PNZT), calcium lead zirconate titanate ($(Pb, Ca)(Zr, Tr)O_3$; PCZT) and strontium lead zirconate titanate ($(Pb, Sr)(Zr, Tr)O_3$; PSZT).

The high dielectric layer 42 of the layered capacitor is formed of the ceramic material described above. Thus, the dielectric constant can be raised. As such, the electrostatic capacitance of the layered capacitor can be increased. As a result, a sufficient decoupling effect can be exerted even under a condition that the frequency of on/off of the semiconductor device is as high as 1 GHz to several ten GHz, for example, 3 GHz to 20 GHz so that the instantaneous drop in potential is likely to occur.

Next, manufacturing of the printed wiring board 100 according to the first embodiment of the invention will be described by referring to respective elements which are not described in the above description.

First, manufacturing of a capacitor component CPP which is a precursor of the layered capacitor CPT will be described.

Upon manufacturing of the capacitor component CPP, a metallic foil 43A having an appropriate thickness, for example, a nickel (Ni) foil of about 100 μm is first prepared (see FIG. 4A). The size of the metallic foil is larger than the area of the IC chip and smaller than the underfill covered area 220.

Figure 4B:
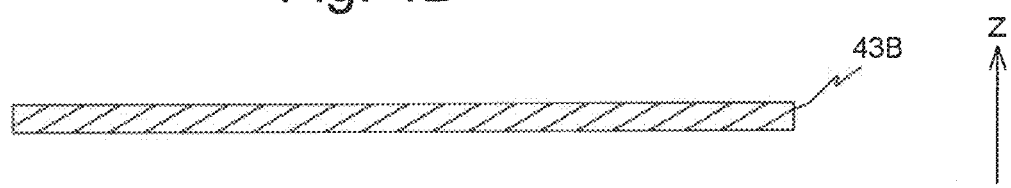
FIG. 4B is a view showing the process of manufacturing the layered capacitor according to the embodiment of the invention (2).
Figure 4C:
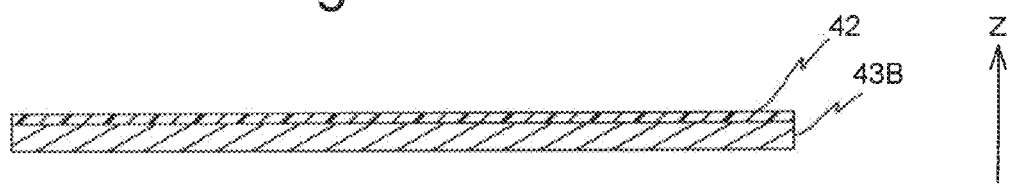
FIG. 4C is a view showing the process of manufacturing the layered capacitor according to the embodiment of the invention (3).

After the metallic foil 43A is heat treated under temperatures of 1,000° C. or less, the surface is ground to obtain a metallic foil 43B with the thickness of 10 to 50 μm (see FIG. 4B).

A sol-gel film is formed on the metallic foil 43B treated in this way, as follows.

Upon formation of the above-mentioned high dielectric layer 42, a barium compound and a titan compound weighed so as to obtain a predetermined concentration (for example, 1.0 mol/L), for example, diethoxyl barium and bitetraisopropoxide titan are dissolved successively into a solvent mixed at an appropriate mixing ratio, for example, a solvent obtained by mixing dehydrated methanol and 2-methoxy ethanol at 3/2 (v/v). This solution is agitated for a desired period of time (for example, three days) in nitrogen atmosphere at a room temperature to prepare an alkoxide precursor composition solution of barium and titan.

Next, decarbonated water is sprayed at a speed of 0.5 microliter/minute in an atmospheric nitrogen current to hydrolyze the precursor composition solution while blending it at a constant temperature of 0° C. to make a sol-gel solution. The sol-gel solution is filtered with a filter to remove deposits and the like, thereby obtaining a filtrate for use in formation of a high dielectric sheet.

The obtained filtrate is applied onto a metallic foil having a predetermined thickness by spin coating and dried by heating at, for example, 150° C. Then, it is heated to a predetermined temperature (for example, 850° C.) and baked for a predetermined period of time. This procedure is repeated a desired cycle to obtain the high dielectric layer 42 having a predetermined thickness (see FIG. 4C).

By using a sol-gel solution having another composition, the high dielectric layer may be formed of any one of strontium titanate ($SrTiO_3$), tantalum oxide ($TaO_3$, $Ta_2O_5$), lead zirconate titanate (PZT), lanthanum lead zirconate titanate (PLZT), niobium lead zirconate titanate (PNZT), calcium lead zirconate titanate (PCZT) and strontium lead zirconate titanate (PSZT).

The high dielectric layer may be manufactured in the following method. This will be explained by taking a case of using barium titanate as an example.

Barium titanate powder (for example, HPBT series manufactured by FUJI CHITAN KOGYO KABUSHIKI KAISHA) is dispersed in a binder solution to obtain a paste. The binder solution can be prepared by mixing a solvent, water and a plasticizer at a desired ratio with respect to the total weight of the barium titanate powder. For example, 5 parts by weight of polyvinyl alcohol, 50 parts by weight of pure water and 1 part by weight of dioctyl phthalate or dibutyl phthalate may be mixed.

The barium titanate powder dispersed in the binder solution is printed on a metallic foil which turns to a first layered electrode later, into a thin film having a predetermined thickness, for example, a thickness of about 5 to 7 µm using printer such as a roll coater, a doctor blade, or α coater and dried under a predetermined condition to produce a non-baked layer. More specifically, it is dried at 60° C. for an hour, at 80° C. for three hours, at 100° C. for an hour, at 120° C. for an hour and at 150° C. for three hours to produce the non-baked layer.

A paste containing at least one kind selected from a group consisting of $SrTiO_3$, $TaO_3$, $Ta_2O_5$, PZT, PLZT, PNZT, PCZT and PSZT may be used, and such a paste is printed into a thin film having a thickness of about 0.1 to 10 µm and dried to produce a non-baked layer similarly.

In the layered capacitor CPT, a distance between the first and second layered electrodes (thickness of the high dielectric layer) is not more than 10 µm and substantially set to a distance which produces no short-circuit. Consequently, the thickness of the high dielectric layer of the layered capacitor CPT is so thin that the electrostatic capacitance of the layered capacitor can be increased.

Next, this non-baked layer is baked at 600 to 950° C. to obtain a high dielectric layer. The high dielectric layer 43 is a ceramic layer produced by baking a thin film 0.1 to 10 µm thick, the thin film being formed using a high dielectric material containing at least one metal oxide selected from a group consisting of $BaTiO_3$, $SrTiO_3$, $TaO_3$, $Ta_2O_5$, PZT, PLZT, PNZT, PCZT and PSZT, under a predetermined condition.

Thereafter, an upper electrode which constitutes part of the second layered electrode is formed using a vacuum evaporation apparatus for sputtering or the like. For such formation of the electrode, a copper layer, a platinum layer, a gold layer or the like may be formed.

Figure 4D:
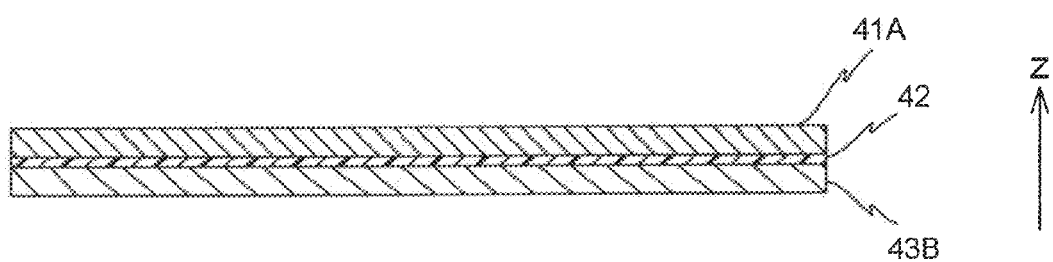
FIG. 4D is a view showing the process of manufacturing the layered capacitor according to the embodiment of the invention (4).

Next, as shown in FIG. 4D, a metallic film (electrolytic plating film) about 10 □m thick is formed by electrolytic plating with copper or the like. As well as copper, nickel and tin may be used.

Subsequently, a marketed dry film type etching resist is affixed onto the metallic foil 43B. Then, the etching resist is patterned by exposure and development on the etching resist.

Figure 4E:
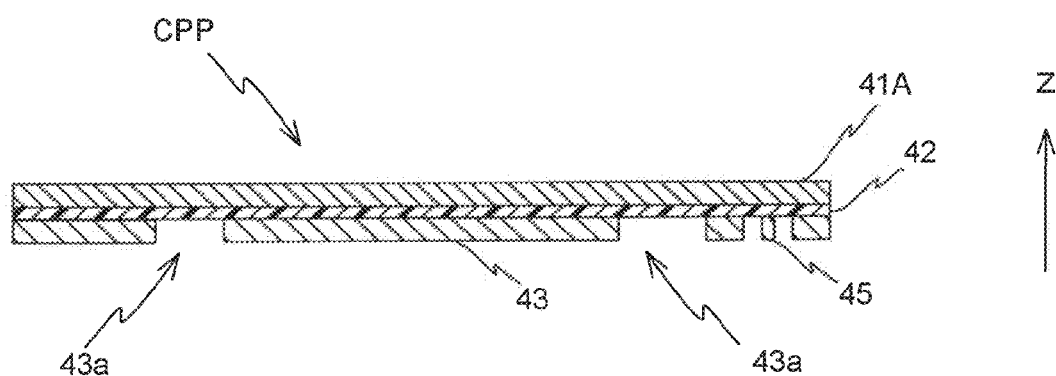
FIG. 4E is a view showing the process of manufacturing the layered capacitor according to the embodiment of the invention (5).

Next, the metallic foil at a portion in which no etching resist is formed is removed with a nitric acid etching solution to form a first layered electrode (first electrode) having the opening 43a (electrode non-formation portion), as shown in FIG. 4E. At this time, the alignment marks 45 are formed at the same time.

Because a portion of the first layered electrode except the openings 43a and a surrounding area around the alignment marks 45 is formed of a conductor, the area of the electrode is increased. This is a so-called plane pattern.

On a premise that the capacitor component CPP has been prepared as described above, manufacturing of the printed wiring board 100 will be described below.

Upon manufacturing of the printed wiring board 100, a core substrate 10 is first prepared (see FIG. 5A). The core substrate 10 includes an insulating substrate 11 with a thickness of 0.6 mm to 1.2 mm, conductor circuits 12, 14 respectively formed on both surfaces of the insulating substrate 11, through hole conductors 15 for connecting the conductor circuit 12 formed on a first surface (surface of the insulating substrate in a +z direction) of the insulating substrate 11 and a second surface (surface opposite to the first surface) of the insulating substrate, and alignment marks 13 (the alignment marks formed on the second surface of the insulating substrate are not shown) formed on both surfaces of the insulating substrate. The alignment marks and the conductor circuits are formed at the same time.

As the insulating substrate 11, it is permissible to use a substrate produced by impregnating a core material such as glass cloth or glass fibers with a thermosetting resin and then hardening the thermosetting resin. For example, a bismaleimide triazine (BT) resin substrate or glass epoxy substrate may be used.

The core substrate is manufactured as follows.

First, a resin filler is prepared. As for preparation of the resin filler, a bisphenol F type epoxy monomer (trade name: YL983U, manufactured by YUKA SHELL Co. Ltd., molecular weight: 310), $SiO_2$ spherical particles (trade name: CRS 1101-CE, manufactured by ADMATECHS Co., Ltd., surface coated with a silane coupling agent, average particle diameter: 1.6 µm, maximum particle diameter: 15 µm or less) and a leveling agent (trade name: PELENNOR S4, manufactured by SANNOPCO) are placed in a container and mixed by agitation to obtain a desired viscosity. As a hardener, an imidazole hardener (trade name: 2E4MZ-CN, manufactured by SHIKOKU KASEI KABUSHIKI KAISHA) is used in a predetermined quantity.

For example, 100 parts by weight of the bisphenol F type epoxy monomer, 170 parts by weight of the $SiO_2$ spherical particles and 1.5 parts by weight of the leveling agent are placed in a container and mixed by agitation to obtain a resin filler having a viscosity of 45 to 49 Pa·s under temperatures of 23±1° C. As the hardener, 6.5 parts by weight of the imidazole hardener is used.

For manufacturing of the core substrate, for example, a copper clad laminate obtained by laminating both surfaces of 0.8 mm thick insulating substrate made of a glass epoxy resin with a 18 μm copper foil (hereinafter referred to as double-sided copper clad laminate) may be used. By drilling the double-sided copper clad laminate, through holes for a through hole conductor are formed.

Next, an electroless copper plating film and an electrolytic copper plating film are formed on the copper foil of the double-sided copper clad laminate and the surface of the through holes to form through hole conductors.

Next, the substrate having the through hole conductors formed therein are washed with water and dried, and then, black oxide treatment and reduction treatment are applied to roughen the surfaces of the through holes conductors 15. The black oxide solution (oxide solution) for use is an aqueous solution containing, for example, NaOH (10 g/L), $NaClO_2$ (40 g/L) and $Na_3PO_4$ (6 g/L), and the reduction solution is an aqueous solution containing, for example, NaOH (10 g/L), $NaClO_2$ (40 g/L), and $Na_3PO_4$ (6 g/L).

Next, the resin filler prepared in the above-described way is in the through hole conductor.

First, the resin filler is pushed into the through hole using a squeegee and dried under a desired condition, for example, at 100° C. for 20 minutes. Subsequently, first grinding of grinding each surface of the substrate to remove an unnecessary resin layer is carried out, and then, second grinding for removing flaws marked in this grinding is carried out. For example, belt sander grinding using a #600 belt grinding paper (manufactured by SANKYO RIKAGAKU Co., Ltd.) may be carried out as the first grinding and buffing may be carried out as the second grinding.

Thereafter, heat treatment is carried out at a predetermined temperature for a predetermined period of time to form a resin filled layer.

Next, the electroless plating film and the electrolytic plating film are formed successively so as to cover the electrolytic copper plating film and the resin filler formed in the above-described way. A conductor circuit as shown in FIG. 5A is formed by a subtractive method. At the same time, a conductor circuit for covering the resin filler is formed.

After the substrate is washed with water and degreased with acid, soft etching is carried out, and then a roughened surface is formed on the entire surface (including the land surfaces of the through hole conductors) of the conductor circuit. For example, an etching solution is sprayed on both surfaces of the substrate to etch the surface of the conductor circuit and the land surface of the through hole conductors.

It is permissible to use, as the etching solution, an etching solution containing an imidasole copper complex, glycolic acid and potassium chloride in a predetermined quantity each. As such an etching solution, it is permissible to use, for example, MEC ETCH BOND (manufactured by MEC Co., Ltd.) containing 10 parts by weight of imidazole copper (II) complex, 7 parts by weight of glycolic acid and 5 parts by weight of potassium chloride.

Next, as shown in FIG. 5B, a first resin insulating layer (resin insulating layer on core) 231 is formed so as to cover the insulating substrate 11, the conductor circuit 12, and the alignment marks 13. The resin insulating layer is formed by laminating, for example, a thermosetting resin film under a lamination condition of 50 to 170° C. in temperature and 0.4 to 1.5 MPa in pressure using a vacuum laminator.

Preferably, the resin insulating layer contains other filler than continuous glass fiber. The other filler than the continuous glass fiber here means that no glass cloth or glass unwoven fabric is contained. If the other filler than the continuous glass fiber is contained, the thermal expansion coefficient of the resin insulating layer becomes closer to the thermal expansion coefficient of a layered capacitor having a high dielectric layer made of ceramic. Thus, a warp of the printed wiring board can be reduced. If the resin insulating layer does not contain the continuous glass fiber (glass cloth or glass unwoven fabric), the layered capacitor can be buried easily.

To form the resin insulating layer, a modified epoxy resin sheet, polyphenylene ether resin sheet, polyimide resin sheet, cyanoester resin sheet and the like may be used, and these sheets in which an inorganic component such as silica, alumina, or zirconia is dispersed may be used. The thickness of the interlayer insulating layer formed is generally 20 to 80 μm and the Young's modulus under a normal temperature is 2 to 7 GPa. More specifically, for example, ABF-45SH (manufactured by AJINOMOTO Corporation) may be used. Although such a thermosetting resin film is in a semi-hardened state when it is laminated, the first resin insulating layer (resin insulating layer on a lower layer) is formed when the thermosetting resin film is hardened.

The core substrate 10 and the capacitor component CPP are positioned using the alignment marks 13 of the core substrate 10 and the alignment mark pattern 45 of the capacitor component CPP. By doing so, the capacitor component CPP is placed with a precision at a predetermined position on the resin insulating layer $23_1$.

Figure 6A:
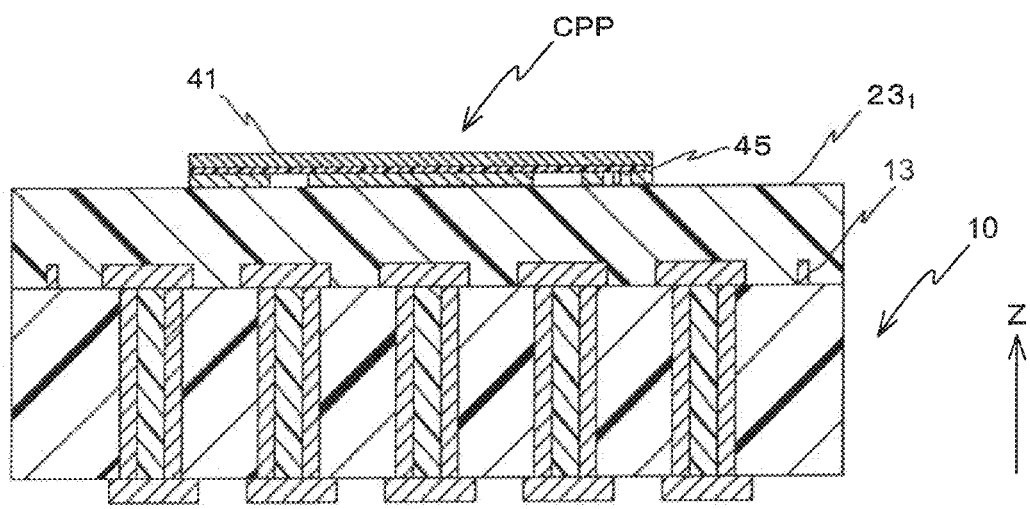
FIG. 6A is a view showing the process of manufacturing the electronic component according to the embodiment of the invention (3).

More specifically, as shown in FIG. 6A, any of the alignment marks formed on the layered capacitor CPT side and any of the alignment marks formed on the core substrate 10 side are recognized with a camera to align them. The alignment mark may be formed on any one of the surfaces the layered capacitor CPT on the +Z side or the −z side or both the surfaces.

Figure 6B:
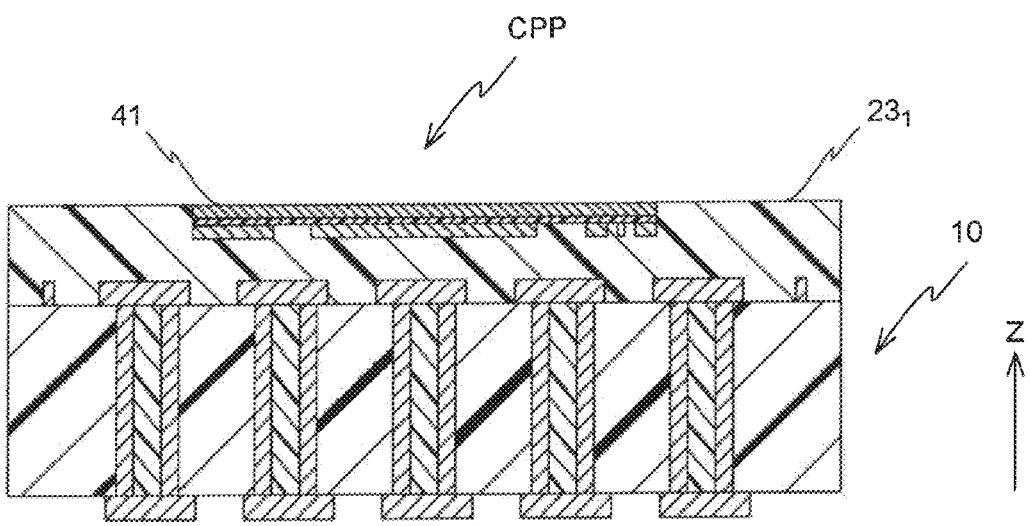
FIG. 6B is a view showing the process of manufacturing the electronic component according to the embodiment of the invention (4).

Next, as shown in FIG. 6B, a vacuum press is used to bury a capacitor component CPP having a baked high dielectric layer in the resin insulating layer $23_1$ and harden the resin insulating layer $23_1$. The vacuum press condition at this time is 130 to 190° C. in temperature, 0.2 to 0.6 MPa in pressure and 1 to 3 hours. The layered capacitor CPT is buried in the first resin insulating layer until the top face of the layered capacitor CPT and the top face of the first resin insulating layer form an identical plane.

Figure 6C:
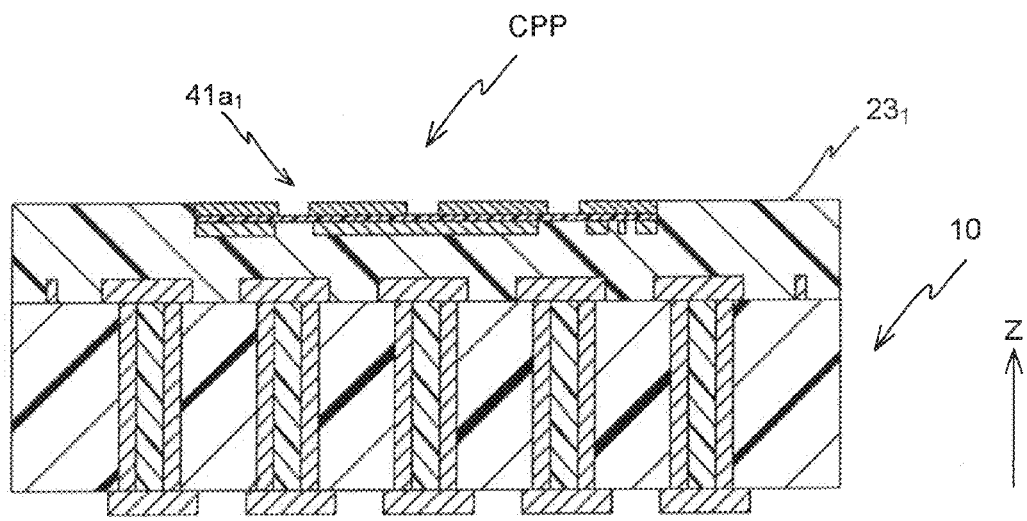
FIG. 6C is a view showing the process of manufacturing the electronic component according to the embodiment of the invention (5).

Next, as shown in FIG. 6C, an opening 41a is provided in an upper electrode 41A (the upper electrode 41A is constituted of a seed layer and a metallic film on the seed layer) of the capacitor component CPP by making use of the alignment marks 13 of the core substrate. The position of the opening is a via hole formation position described later. The formation of the opening is based on a known subtractive method.

Figure 6D:
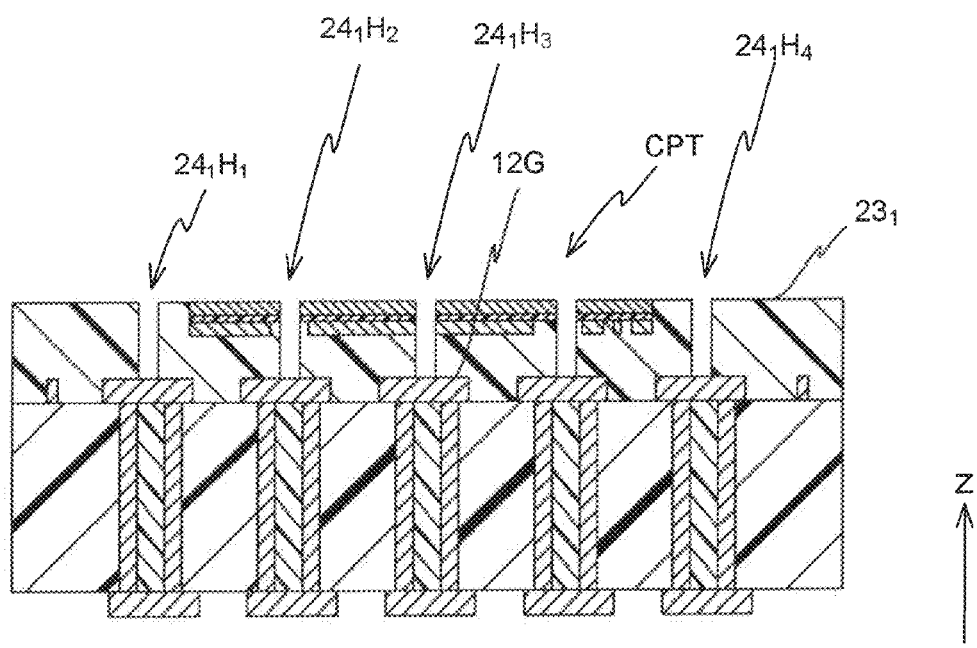
FIG. 6D is a view showing the process of manufacturing the electronic component according to the embodiment of the invention (6).

Next, as shown in FIG. 6D, through holes $24_1H_j$ (j=1-N, N=3 is assumed here) are formed. The through holes 24H to be formed here include a through hole $24_1H_1$ which has reached a power supply conductor pattern on the core substrate, a through hole $24_1H_2$ which has reached a ground conductor pattern on the core substrate, and a through hole $24_1H_3$ which has reached a signal conductor pattern on the core substrate. These through holes can be formed by a $CO_2$ laser, UV laser or the like.

Figure 6E:
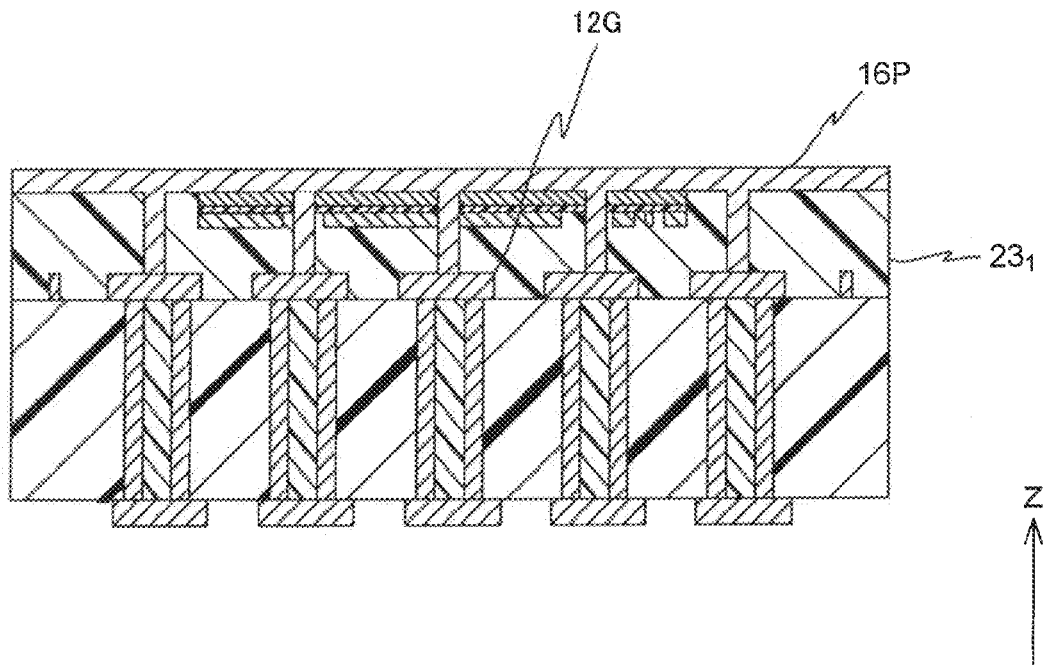
FIG. 6E is a view showing the process of manufacturing the electronic component according to the embodiment of the invention (7).

As shown in FIG. 6E, a plating film 16P composed of an electroless plating film (electroless copper plating film) and an electrolytic plating film (electrolytic copper plating film)

formed on the electroless plating film is formed within the via hole and on the resin insulating layer $23_1$ and the conductor layer 41.

Figure 6F:
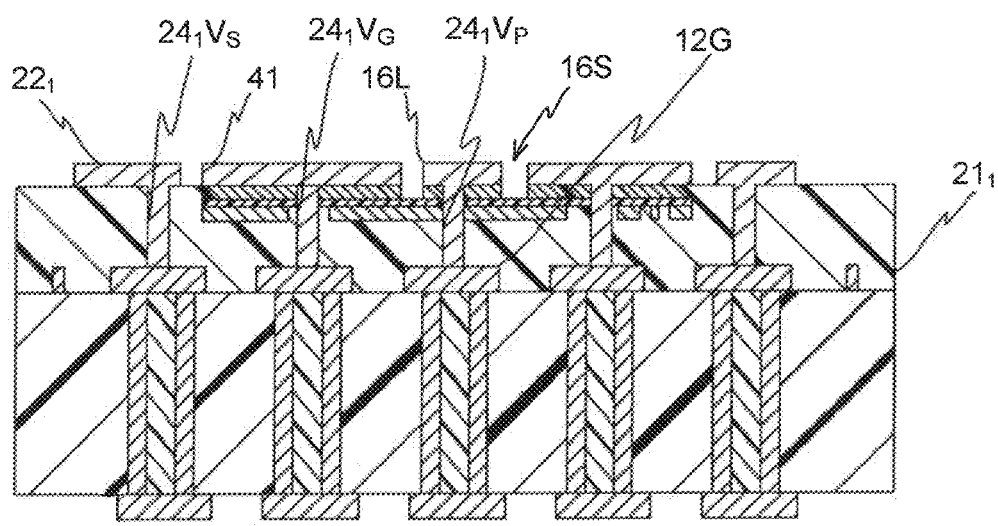
FIG. 6F is a view showing the process of manufacturing the electronic component according to the embodiment of the invention (8).

Next, as shown in FIG. 6F, the plating film 16P and the conductor layer 41 are patterned by the subtractive method to form a via conductor (via conductor $24_1V_g$ for grounding, via conductor $24_1V_p$ for power supply, via conductor $24_1V_s$ for signal), a conductor pattern (conductor pattern for power supply, conductor pattern for grounding, conductor pattern for signal) $22_1$, the second layered electrode 41, and the first via land 16L. The second layered electrode 41 is constituted of the plating film 16P and the upper electrode layer 41A. The second layered electrode has a space portion 16S in which no conductor is formed, around the first via land 16L which is connected to the via conductor for grounding. Because the second layered electrode 41 is a so-called plane pattern so that other portion than the space portion serves for the conductor layer, the area of the electrode is increased. Further, because the first and second layered electrodes are plane patterns, the capacity of the capacitor is increased.

The via conductor $24_1$ formed in the resin insulating layer on the core is connected to the conductor circuit on the core substrate and the conductor circuit formed in the resin insulating layer on the core. The via conductor $24_1V_p$ for power supply is connected to the conductor circuit for power supply on the core substrate and the conductor circuit for power supply formed in the resin insulating layer on the core. The via conductor $24_1V_g$ for grounding connects the conductor circuit for grounding on the core substrate with the conductor circuit for grounding formed in the resin insulating layer on the core. The via conductor $24_1V_s$ for signal connects the conductor circuit for signal on the core substrate with the conductor circuit for signal formed in the resin insulating layer on the core.

Figure 7A:
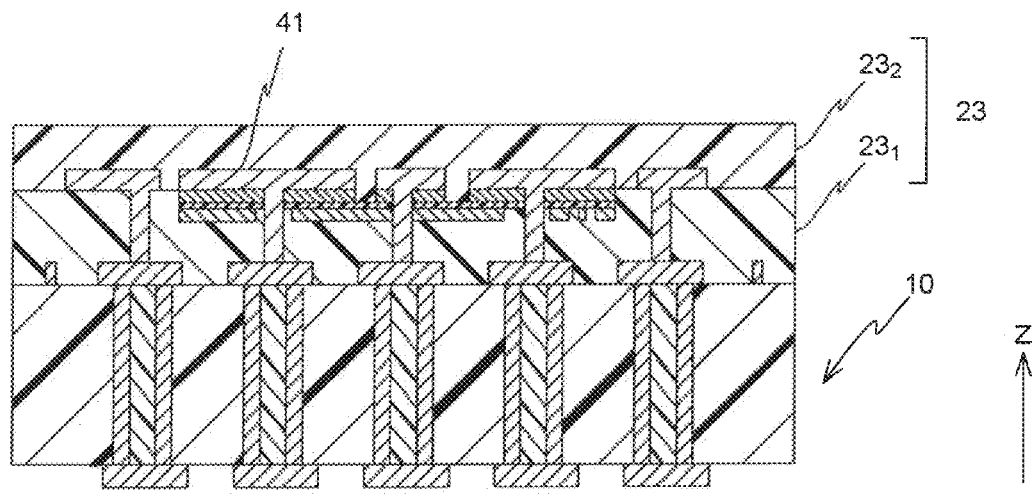
FIG. 7A is a view showing the process of manufacturing the electronic component according to the embodiment of the invention (9).

As shown in FIG. 7A, a second resin insulating layer $23_2$ (uppermost interlayer resin insulating layer) so as to cover the first resin insulating layer $23_1$ (resin insulating layer on the core), the second layered electrode 41, the conductor circuit $22_1$ and the second via land 16L. The second resin insulating layer can be made using the same material as the first resin insulating layer.

Figure 7B:
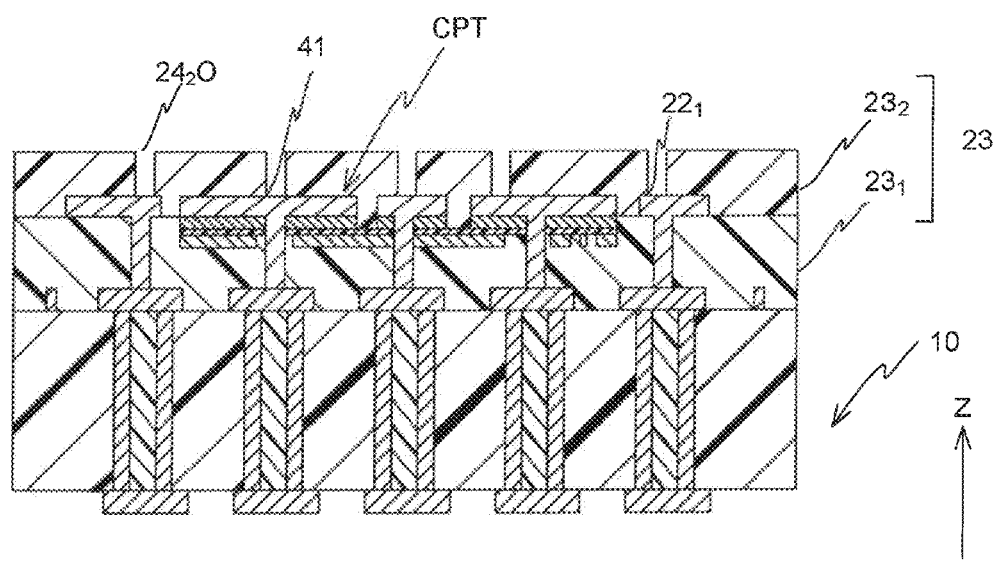
FIG. 7B is a view showing the process of manufacturing the electronic component according to the embodiment of the invention (10).

Next, as shown in FIG. 7B, laser is irradiated to plural predetermined positions of the second resin insulating layer $23_2$ to form via holes $24_2O$ (through holes) which reach the conductor circuit $22_1$, the first layered electrode 41 or the second via land 16L. Then, a catalyst is formed on the surface of a substrate in which the through holes are formed. Next, an electroless plating film is formed on the surface of the substrate.

Figure 8:
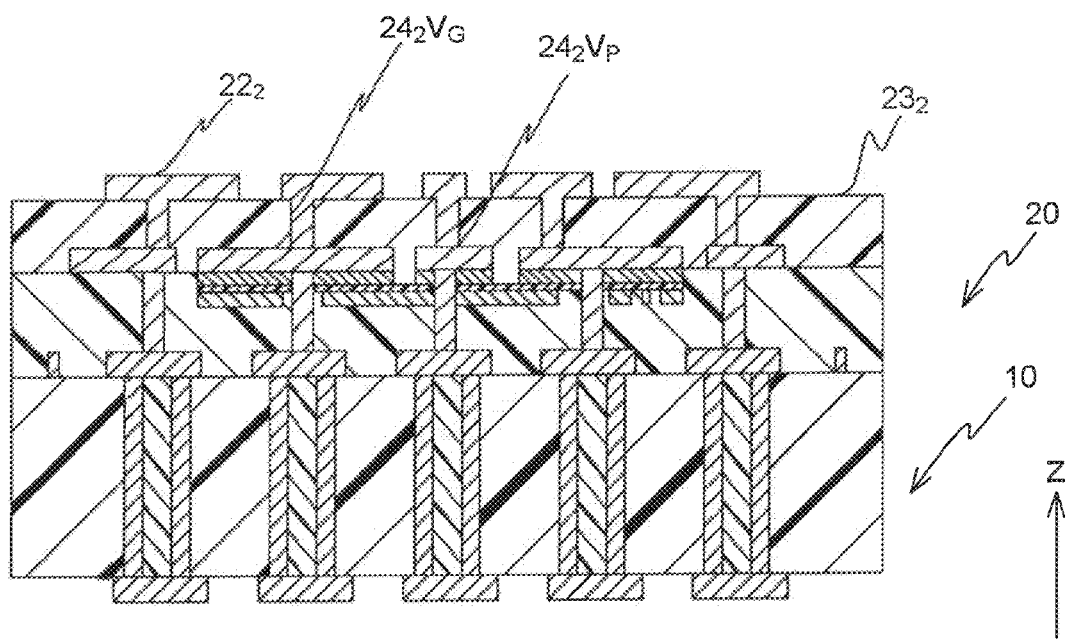
FIG. 8 is a view showing the process of manufacturing the electronic component according to the embodiment of the invention (11).

Thereafter, a plating resist is formed on the electroless plating film and subsequently, exposure and development processing is applied on the plating resist to pattern the plating resist. Next, an electrolytic plating film is formed in an area in which the plating resist is not formed. By removing the electroless plating film between the electrolytic plating films after the plating resist is peeled, a conductor pattern $22_2$ and a via conductor $24_2$ are formed of the electroless plating film and the electrolytic plating film on the electroless plating film as shown in FIG. 8.

The above-described manufacturing method is a known semi-additive method. The via conductor connects the conductor circuits formed on different resin insulating layers to perform interlayer connection.

More specifically, a via conductor $24_2V_G$ for grounding connects the conductor circuit for grounding formed on the uppermost resin insulating layer with the first electrode or the conductor circuit for grounding formed on the resin insulating layer on the core. Further, the via conductor $24_2V_p$ for power supply connects the conductor circuit for power supply formed on the uppermost resin insulating layer with the second via land or the conductor circuit for power supply formed on the first resin insulating layer (resin insulating layer on the core). The via conductor $24_2V_s$ for signal connects the conductor circuit for signal formed on the uppermost resin insulating layer with the conductor circuit for signal formed on the first resin insulating layer (resin insulating layer on the core).

The process of forming the resin insulating layer, the conductor layer and the via conductor is repeated a desired number of times to form a laminated portion 20 including a desired number of layers N (N=2 in this embodiment) of each of the resin insulating layers $23_j$ (j=1 to N), the conductor layers $22_j$ (j=1 to N) and the via conductors $24_j$ (j=1 to N) (see FIG. 6I). Part of the conductor circuit (outermost conductor circuit) $22_N$ formed on the surface of the outermost layer in the laminated portion 20 serves as an IC mounting pad for mounting the IC chip.

Subsequently, a solder resist 30 is formed on the surface of the laminated portion 20 (on uppermost resin insulating layer and outermost conductor circuit). In forming the solder resist 30, for example, a marketed solder resist composition is applied and then subjected to drying treatment. Thereafter, exposure and development are executed using a mask to form an opening, from which part of the conductor circuit is exposed, in the solder resist. A portion of the conductor circuit exposed by the opening formed in the solder resist serves as a semiconductor device mounting pad. After the solder resist 30 is formed, a nickel plating film and a gold plating film are formed on the semiconductor device mounting pad by electroless plating using a desired solution.

Figure 9A:
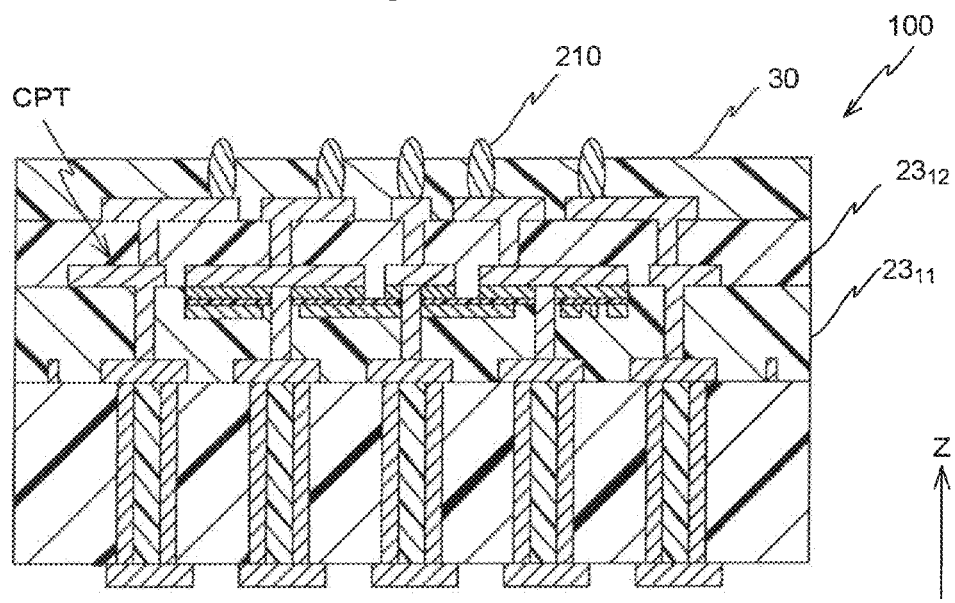
FIG. 9A is a view showing the process of manufacturing the electronic component according to the embodiment of the invention (13).

Thereafter, as shown in FIG. 9A, a solder member (solder bump) 210 is formed. The solder bump is formed by printing and reflowing a solder paste.

The first resin insulating layer in FIG. 1 corresponds to the resin insulating layer of the lower layer and the uppermost resin insulating layer corresponds to the resin insulating layer of the upper layer.

In the above-described way, the multilayered printed wiring board 100 incorporating the layered capacitor CPT is manufactured. The printed wiring board of FIG. 9A is an example in which the resin insulating layer, the conductor circuit and the solder resist are formed on one side of the core substrate.

FIG. 11 shows another embodiment of the present invention. A printed wiring board 100A of FIG. 11 has a resin insulating layer, conductor circuits, via conductors, solder resists 30A, 30B and solder bumps 210A, 210B on both faces thereof.

The printed wiring board 100A can be mounted with a semiconductor device through the solder bump. Then, the surface (+Z side surface, that is, the surface on which the semiconductor device mounting pad is formed) of the printed wiring board 100A has an underfill covered area which is covered with an underfill resin 220A.

Next, an example that the printed wiring board 100 of the first embodiment of the invention is used as an electronic component will be described.

Figure 9B:
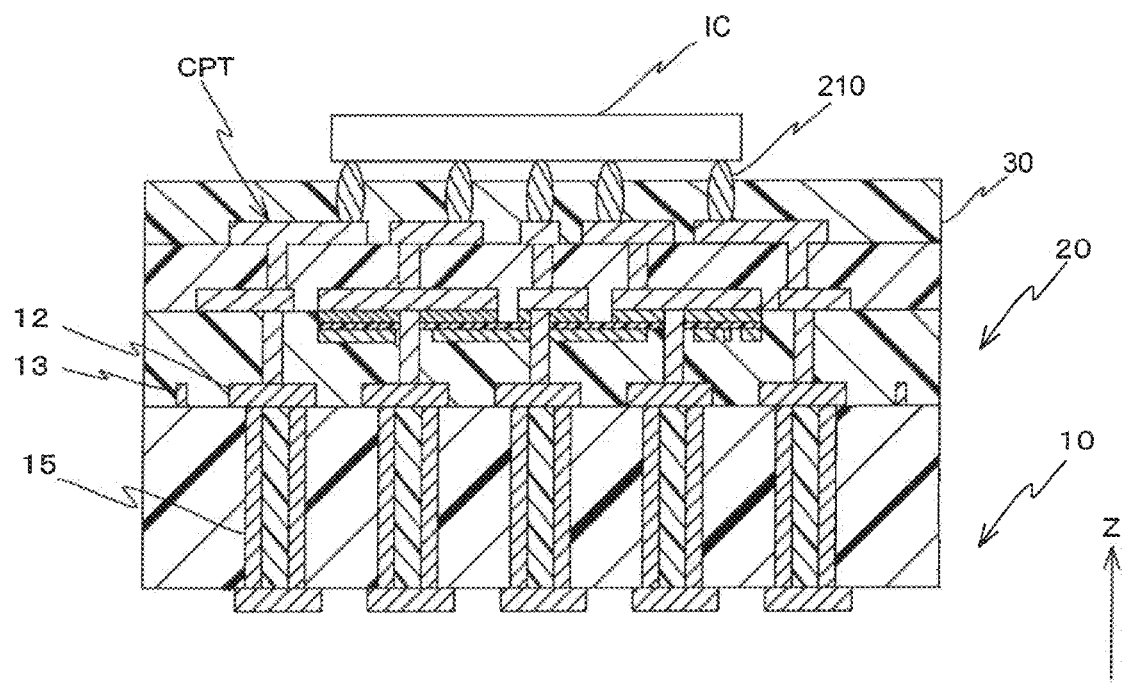
FIG. 9B is a view showing the process of manufacturing the electronic component according to the embodiment of the invention (14).

As shown in FIG. 9B, an IC chip is first mounted on the printed wiring board. In mounting the IC chip, a number of connection terminals arranged on the rear face of the IC chip are brought into contact with the solder member 210 on a corresponding semiconductor device mounting pad. Then, each terminal is joined to the component mounting pad through the solder member 210 by reflow.

Figure 10:
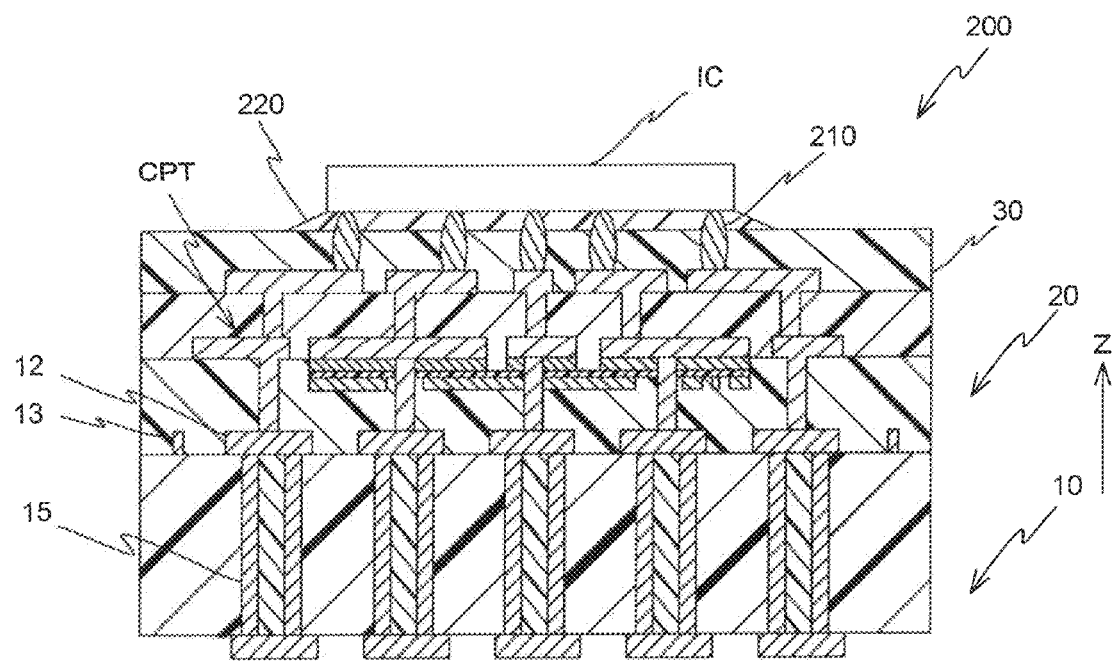
FIG. 10 is a view showing the process of manufacturing the electronic component according to the embodiment of the invention (15).

Next, as shown in FIG. 10, the underfill resin 220 is filled between the printed wiring board 100 and the IC chip. By doing so, an electronic component 200 is manufactured. Here, the size of the layered capacitor is smaller than the underfill covered area and larger than the IC chip. The position at which the layered capacitor is formed is just below the underfill covered area and the IC chip. A projection plane of the underfill covered area which is projected to a face on which the layered capacitor is formed one to one includes the area in which the layered capacitor is formed. Further, the projection plane of the IC chip which is projected to the face on which the layered capacitor is formed one to one is included in the area in which the layered capacitor is formed.

The electronic component 200 manufactured as described above can be bonded to another printed wiring board such as a mother board.

Adopting the above-described structure enables the layered capacitor to be incorporated in a portion of the printed wiring board having small warp or deformation while securing the size of the electrode area of the layered capacitor. As a result, the layered capacitor hardly suffers from cracks.

Further, even if a defect such as crack occurs in the layered capacitor, deterioration of insulation unlikely occurs due to absorption of moisture because the layered capacitor is arranged just under the underfill resin. Because most of the layered capacitor is arranged just under the IC chip, it is hardly affected by absorption of moisture.

Because as shown in FIG. 9B, the layered capacitor is incorporated between the face mounted with the IC chip and the core substrate, absorption of moisture from the surface of the printed wiring board opposite to the face mounted with the IC chip is blocked easily by the thick core substrate.

Further, the length of wiring from an external power supply to the layered capacitor and to an integrated circuit chip can be reduced. Consequently, even if any integrated circuit chip in which an interval of on/off of the semiconductor device incorporated is short and the frequency thereof is in a high range as described above is mounted, a sufficient decoupling effect can be obtained.

In the above embodiment, the laminated portion 20 has two-layer structure constituted of the first resin insulating layer $23_1$ and the uppermost resin insulating layer $23_2$, and the layered capacitor CPT is arranged between the first resin insulating layer and the uppermost resin insulating layer.

However, the quantity of the resin insulating layers on the side of the integrated circuit chip in the laminated portion 20 may be three or more, and the layered capacitor CPT may be arranged between the uppermost layer resin and the resin insulating layer formed thereunder.

Needless to say, the size of the underfill covered area formed on the surface (on the solder resist) of the printed wiring board can be adjusted by, for example, adjusting the height of the solder bump to control a distance between the printed wiring board and the IC chip. Additionally, the size of the underfill covered area can be adjusted by controlling the viscosity of the underfill agent or adjusting a position where the underfill agent is to be applied.

EXAMPLES

Hereinafter, the present invention will be described more in detail by taking examples, but the present invention is not limited to these examples.

Example 1

(1-1) Formation of High Dielectric Sheet (a) Heat Treatment of Nickel Foil

The size of a nickel (Ni) foil of 100 μm in thickness, which turns to the first layered electrode (first electrode) 43 later, was made larger than that of an integrated circuit chip to be mounted on a post process and smaller than an underfill formation area (see FIG. 4A). Heat treatment was carried out at about 1,000° C. Next, the surface of the Ni foil was ground to make the thickness about 90 μm (see FIG. 4B).

(b) Adjustment of Sol-Gel Film Forming Solution

Diethoxyl barium and bitetraisopropoxide titan were weighed so as to obtain 1.0 mol/L and dissolved successively in a solvent obtained by mixing dehydrated methanol and 2-methoxy ethanol at 3/2 (v/v). This solution was agitated for three days in nitrogen atmosphere at a room temperature to prepare an alkoxide precursor composition solution of barium and titan.

Next, the precursor composition solution was agitated kept at 0° C., and preliminarily decarbonated water was sprayed in a nitrogen air stream at 0.5 μL/minute to execute hydrolysis in order to prepare a sol-gel solution. The sol-gel solution was filtered with a 0.2 μm filter to obtain a filtrate for use in formation of the high dielectric sheet.

The viscosity of the filtrate was adjusted so that the thickness of a film formed by one cycle of spin coat/drying/baking described later was about 0.03 μm.

(c) Formation of Sol-Gel Film

The obtained filtrate was applied onto the aforementioned Ni foil by spin coat at 1,500 rpm for a minute and dried by heating on a hot plate held at 150° C. for three minutes, followed by being baked in an electric furnace held at 850° C. for 15 minutes. This process was repeated 30 times to form a sol-gel film of about 0.9 μm in thickness (see FIG. 4C).

(d) Formation of Upper Electrode

Next, a copper layer was formed by sputtering using a vacuum evaporation apparatus. Then, an electrolytic plating film of about 10 μm in thickness was formed by electrolytic plating for use as an upper electrode (part of the second electrode) (see FIG. 4D).

(e) Formation of Lower Electrode Patterning and Alignment Mark

The electrodes and alignment marks were formed at the same time by patterning the lower electrode by the known subtractive method, to form a high dielectric sheet (see FIG. 4E).

(1-2) Manufacturing of Core Substrate (a) Preparation of Resin Filler 100 parts by weight of a bisphenol F type epoxy monomer (trade name: YL983U, manufactured by YUKA SHELL Co., Ltd., molecular weight: 310), 170 parts by weight of $SiO_2$ spherical particles (trade name: CRS 1101-CE, manufactured by ADMATECHS Co., Ltd., surface coated with a silane coupling agent, average particle diameter: 1.6 μm, maximum particle diameter: 15 μm or less) and 1.5 parts by weight of a leveling agent (trade name: PELENNOR S4, manufactured by SANNOPCO Limited) were placed in a container and mixed by agitation to prepare a resin filler having a viscosity of 45 to 49 Pa·s under temperatures of 23±1° C.

As a hardener, 6.5 parts by weight of an imidazole hardener (trade name: 2E4MZ-CN, manufactured by SHIKOKU KASEI KABUSHIKI KAISHA) was used.

(b) Manufacturing of Multilayered Printed Wiring Board

Prepared was a copper clad laminate obtained by laminating a copper foil of 18 μm in thickness on both surfaces of an insulating substrate made of a glass epoxy resin with a thickness of 0.8 mm. The copper clad laminate was drilled to form a through hole for a through hole conductor.

The surface of the copper foil and the through hole was subjected subsequently to electroless copper plating process and electrolytic copper plating process to form a through hole conductor composed of an electroless copper plating film and an electrolytic plating film, formed on the electroless copper plating film.

Next, the substrate having the through hole formed therein was washed with water and dried, followed by applying black oxide treatment and reduction treatment to roughen the surface of the through hole conductor.

As the black oxide solution (oxide solution), an aqueous solution containing NaOH (10 g/L), $NaClO_2$ (40 g/L), and $Na_3PO_4$ (6 g/L) was used. As the reduction solution, an aqueous solution containing NaOH (10 g/L), $NaClO_2$ (40 g/L), and $Na_3PO_4$ (6 g/L) was used.

Next, the resin filler described in the above (a) was in the through hole conductor.

First, the resin filler was pushed into the through hole using a squeegee and dried at 100° C. for 20 minutes. Subsequently, one side of the substrate was subjected to belt sander grinding using #600 belt grinding paper (manufactured by SANKYO RIKAGAKU Co., Ltd.) such that no resin filler was left on the electrolytic copper plating film. Next, buffing was carried out to remove flaws marked by the belt sander grinding. Such sequential grindings were carried out also on the other side of the substrate.

Thereafter, heat treatment was carried out at 100° C. for an hour, at 120° C. for three hours, at 150° C. for an hour and at 180° C. for seven hours to form a resin filled layer.

Next, the electroless plating film and the electrolytic plating film were formed successively on the electrolytic copper plating film and the resin filler. Subsequently, a conductor circuit was formed on the insulating substrate 11 by the subtractive method. At the same time, a conductor circuit for covering the resin filler was also formed (see FIG. 5A).

After the substrate was washed with water and degreased with acid, soft etching was applied. Next, an etching solution was sprayed on both surfaces of the substrate and the surface of the conductor circuit 14 and the land surface of the through hole conductor 19 were etched to form a roughened surface (not shown) on the entire surface (including the land surfaces of the through holes 19) of the conductor circuit 14.

As the etching solution used was an etching solution (trade name: MEC ETCH BOND, manufactured by MEC Co., Ltd.) containing 10 parts by weight of imidasole copper (II) complex, 7 parts by weight of glycolic acid and 5 parts by weight of potassium chloride.

Next, a resin film was laminated onto the core substrate under a lamination condition of 50 to 170° C. in temperature and 0.4 to 1.5 MPa in pressure using a vacuum laminator. ABF-45SH (manufactured by AJINOMOTO Corporation) was used as the resin film.

Next, the high dielectric sheet was aligned on the resin film in a semi-hardened state and laminated thereon (see FIG. 6A). The sheet and resin film were aligned by recognizing the alignment mark of the high dielectric sheet and the alignment mark of the core substrate using a camera.

Thereafter, the high dielectric sheet was buried into the resin film by vacuum press under a pressing condition of 0.4 MPa, 170° C. for two hours, and the resin film was hardened. The high dielectric sheet was buried in the first resin insulating layer 23₁ such that the top surface of the high dielectric sheet (top face of the first layered electrode) and the top surface of the first resin insulating layer were flush with each other (see FIG. 6B). The resin film was hardened to obtain the first resin insulating layer.

An opening was formed by patterning the upper electrode according to the subtractive method (see FIG. 6C). The position of the opening formed in the upper electrode is the position at which a via hole described later is to be formed.

Next, a via hole which passed through the high dielectric sheet to reach the conductor circuit of the core substrate was formed (see FIG. 6D). This via hole was formed by UV laser.

By dipping in a catalytic solution containing $PdCl_2$ and $SnCl_2$, a palladium catalyst was applied to allow palladium metal to be deposited on the surface of the substrate. Then, the substrate was dipped in a plating solution having the following composition (34 □C of temperature of the solution) for about 40 minutes to form an electroless copper plating film with a thickness of about 0.6 to 3.0 μm.

| Compound | Content |
| --- | --- |
| Copper sulfate | 0.03 mol/L |
| EDTA | 0.20 mol/L |
| HCHO | 0.1 g/L |
| NaOH | 0.1 mol/L |
| α,α'-bipyridyl | 100 mg/L |
| polyethylene glycol (PEG) | 0.1 g/L |

Subsequently, an electrolytic plating film of 25 μm in thickness was formed on the electroless plating film with the aforementioned electroless plating film as seed metal, to form a plating film 16P composed of the electroless plating film and the electrolytic film formed on the electroless plating film (see FIG. 6E). An etching resist was formed on the plating film using a vacuum laminator.

After exposure and development processing was applied on the etching resist, the plating film 16P and the upper electrode at an etching resist non-formation portion were removed by etching. As shown in FIG. 6F, a conductor circuit 22₁, a first electrode 41, a second via land 16L and a via conductor 24₁V were formed.

| Compound | Content |
| --- | --- |
| Sulfuric acid | 200 g/L |
| Copper sulfate | 80 g/L |
| Additive (trade name: KAPARASHIDO GL, manufactured by ATOTECH JAPAN K. K.) | 19.5 ml/L |

Electrolytic copper plating condition: current density of 1 $A/dm^2$, power feeding time of 115 minutes, solution temperature of 23±2° C.)

As the etching solution used was an etching solution (trade name: MEC ETCH BOND, manufactured by MEC Co., Ltd.) containing 10 parts by weight of imidasole copper (II) complex, 7 parts by weight of glycolic acid and 5 parts by weight of potassium chloride. In the same way as described above, the surfaces of the conductor circuit, the first electrode and the second via land were roughened and subsequently, a resin film was laminated on the first resin insulating layer, the conductor circuit, the first electrode and the second via land. Thereafter, the resin film was hardened to obtain the uppermost resin insulating layer (see FIG. 7A).

A via hole 24₂O for via conductor was formed in the uppermost resin insulating layer (see FIG. 7B). The via hole was formed such that it reached the conductor circuit, the first electrode and the second via land on the first resin insulating layer.

After the surface of the uppermost resin insulating layer was roughened, a catalyst was formed on the surface of the resin insulating layer and within the via holes. Next, an electroless copper plating film was formed on the surface of the resin insulating layer and within the via holes. A marketed plating resist was applied onto the electroless plating film, and exposure and development processing was applied onto the plating resist to pattern the plating resist. Thereafter, an electrolytic copper plating film was formed at a plating resist non-formation portion.

Next, the plating resist was removed and the electroless plating film between adjoining electrolytic copper plating films was removed by etching. Consequently, conductor circuits (conductor circuit for power supply, conductor circuit for grounding and conductor circuit for signal) were formed on the uppermost resin insulating layer. Further, via conductors (via conductor for power supply, via conductor for grounding, and via conductor for signal) were formed in the uppermost resin insulating layer (see FIG. 8).

Accordingly, the conductor circuit on the first resin insulating layer and the conductor circuit on the uppermost resin insulating layer were connected by the via conductor formed in the uppermost resin insulating layer. The procedure from formation of the resin insulating layer using ABF-45SH (manufactured by AJINOMOTO Corporation) to formation of the conductor circuit and the via conductor was repeated two times to form a build-up portion according to the semi-additive method.

Next, a solder resist was formed on the uppermost resin insulating layer and the conductor circuit formed on the uppermost layer.

Thereafter, openings from which the conductor circuit formed on the uppermost layer was exposed were formed in the solder resist layer. Some portion of the conductor circuit (conductor circuit formed on the uppermost resin insulating layer) exposed from the opening formed in the solder resist layer serves as a pad.

Here, the pad for power supply, the pad for grounding and the pad for signal were formed. The pad for power supply is electrically connected to the second layered electrode through the via conductor and the conductor circuit. The pad for grounding is connected electrically to the first layered electrode through the via conductor and the conductor circuit.

Next, a solder paste was printed on the pad and solder bumps were formed by reflow to form a printed wiring board 100 (see FIG. 9A).

An IC chip was mounted on the solder bumps, and a marketed underfill resin was filled between the IC chip and the printed wiring board and hardened to obtain an electronic component 200 (see FIG. 9B). The area of the underfill formed on the surface (on the solder resist) of the printed wiring board was adjusted to be larger than the capacitor (see FIG. 2).

As described above, the multilayered printed wiring board according to the present invention is useful as a printed wiring board having a layered capacitor and is suitable for achieving reduction in the size of electronic apparatuses.

Further, the multilayered printed wiring board according to the present invention is suitable for manufacturing a multilayered printed wiring board having an excellent insulation reliability while maintaining a sufficient decoupling effect with a good yield.

Embodiments of the present invention are directed to providing a printed wiring board a warp of which is minimized to improve insulation reliability while preventing generation of cracks in a layered capacitor.

Provided is a capacitor-incorporated printed wiring board including a capacitor constituted of a ceramic high dielectric layer and a first electrode and a second electrode sandwiching the high dielectric layer. A semiconductor device mounting pad including a plurality of first pads and a plurality of second pads is formed on a uppermost resin insulating layer. A covered area covered with an underfill resin between the semiconductor device and the printed wiring board is larger in size than an area in which the high dielectric layer is formed. The capacitor is located just under the underfill covered area.

Obviously, numerous modifications and variations of the present invention are possible in light of the above teachings. It is therefore to be understood that within the scope of the appended claims, the invention may be practiced otherwise than as specifically described herein.

What is claimed is:

1. A printed wiring board, comprising:
an insulating layer;
a capacitor including a ceramic high dielectric layer, a first electrode and a second electrode, the high dielectric layer being interposed between the first and second electrodes such that a distance between the first and second electrodes is not more than 10 µm;
a plurality of resin insulating layers formed on the insulating layer and including at least one upper resin insulating layer provided on a first electrode side of the capacitor, and at least one lower resin insulating layer provided on a second electrode side of the capacitor;
a semiconductor device mounting pad including a first pad and a second pad, the semiconductor device mounting pad being formed on an outermost resin insulating layer of the at least one upper resin insulating layer;
a first via conductor formed in one of the at least one upper resin insulating layer to electrically connect the first pad with the first electrode;
a second via conductor formed in said one of the at least one of upper resin insulating layer to electrically connect the second pad with the second electrode; and
an underfill covered area covered with an underfill resin provided between a semiconductor device to be mounted on the semiconductor device mounting pad, and the printed wiring board, the underfill covered area being provided on a surface of the printed wiring board facing the semiconductor device, wherein:
when the underfill covered area is projected, along and parallel to a lamination direction of the resin insulating layers, to a face on which the high dielectric layer is formed, the underfill covered area is larger than an area in which the high dielectric layer is formed,
when the high dielectric layer is projected, along and parallel to the lamination direction of the resin insulating layers, to a face on which the semiconductor device is mounted, the area in which the high dielectric layer is formed is larger than a semiconductor device mounting area,
the underfill covered area contains an entirety of the area in which the high dielectric layer is formed, which contains an entirety of a pad formation area in which all mounting pads are formed, and
the capacitor is located under the underfill covered area.

2. The printed wiring board according to claim 1, wherein the semiconductor device mounting pad is formed in the pad formation area, and when the high dielectric layer is projected along and parallel to the lamination direction of the resin insulating layers to a face on which the pad is formed, the pad formation area is smaller than the area in which the high dielectric layer is formed.

3. The printed wiring board according to claim 1, wherein, when a semiconductor device is mounted on the printed wiring board by way of the semiconductor device mounting pad, the capacitor is located under the semiconductor device, and when the semiconductor device is projected along and parallel the lamination direction of the resin insulating layers to the face on which the high dielectric layer is formed, the semiconductor device mounting area is contained in the area in which the high dielectric layer is formed.

4. The printed wiring board according to claim 1, wherein the underfill resin is formed on the outermost resin insulating layer.

5. The printed wiring board according to claim 1, further comprising a solder resist layer formed on the outermost resin insulating layer, wherein the underfill resin is formed on the solder resist layer.

6. The printed wiring board according to claim 1, wherein the high dielectric layer includes a baked raw material containing at least one metal oxide selected from a group consisting of barium titanate, strontium titanate, tantalum oxide, lead zirconate titanate, lanthanum lead zirconate titanate, niobium lead zirconate titanate, calcium lead zirconate titanate and strontium lead zirconate titanate.

7. The printed wiring board according to claim 1, wherein at least one of the plurality of resin insulating layers contains a filler other than a continuous glass fiber.

8. The printed wiring board according to claim 1, wherein the first electrode is a ground electrode made of nickel, and the second electrode is a power supply electrode made of copper.

9. The printed wiring board according to claim 1, wherein the insulating layer comprises:

a resin substrate including any one selected from a group consisting of glass cloth, glass unwoven fabric and aramid fiber as a core material thereof, and a core material impregnated with a thermosetting resin.

10. An electronic component, comprising:

the printed wiring board according to claim 1;

an integrated circuit chip mounted on a chip mounting portion formed on a surface of the printed wiring board; and an underfill material filled between the surface and the integrated circuit chip.

* * * * *